(12) United States Patent
Kim et al.

(10) Patent No.: US 9,209,812 B2
(45) Date of Patent: Dec. 8, 2015

(54) VOLTAGE LEVEL CONVERSION CIRCUITS AND DISPLAY DEVICES INCLUDING THE SAME

(71) Applicant: Samsung Electronics Co., Ltd., Suwon-Si, Gyeonggi-Do (KR)

(72) Inventors: Hyung-Tae Kim, Hwaseong-si (KR); Ji-Woon Jung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 52 days.

(21) Appl. No.: 14/183,662

(22) Filed: Feb. 19, 2014

(65) Prior Publication Data

US 2014/0240208 A1 Aug. 28, 2014

(30) Foreign Application Priority Data

Feb. 25, 2013 (KR) .................. 10-2013-0019749

(51) Int. Cl.
| | |
|---|---|
| *H03L 5/00* | (2006.01) |
| *G09G 3/36* | (2006.01) |
| *H03K 3/356* | (2006.01) |
| *H03K 19/0185* | (2006.01) |

(52) U.S. Cl.
CPC .............. *H03L 5/00* (2013.01); *G09G 3/3688* (2013.01); *G09G 3/3696* (2013.01); *H03K 3/35613* (2013.01); *H03K 19/018528* (2013.01); *G09G 3/3648* (2013.01); *G09G 3/3677* (2013.01); *G09G 2310/0289* (2013.01)

(58) Field of Classification Search
None
See application file for complete search history.

(56) References Cited

U.S. PATENT DOCUMENTS

| | | | |
|---|---|---|---|
| 6,233,188 B1 | 5/2001 | Kai | |
| 6,445,210 B2 | 9/2002 | Nojiri | |
| 7,777,549 B2 | 8/2010 | Harada | |
| 7,800,407 B1 | 9/2010 | Agarwal et al. | |
| 7,880,501 B2 * | 2/2011 | Han et al. .................. | 326/68 |
| 7,952,415 B2 * | 5/2011 | Shim ........................ | 327/333 |
| 8,283,964 B2 * | 10/2012 | Cassia ....................... | 327/333 |
| 2010/0301900 A1 | 12/2010 | Deng | |

FOREIGN PATENT DOCUMENTS

| | | |
|---|---|---|
| EP | 1128356 A2 | 8/2001 |
| JP | 2001043681 A | 2/2001 |
| JP | 2004007821 A | 1/2004 |
| JP | 2009219018 A | 9/2009 |

* cited by examiner

*Primary Examiner* — Nicholas Lee
*Assistant Examiner* — Duane N Taylor, Jr.
(74) *Attorney, Agent, or Firm* — Harness, Dickey & Pierce, P.L.C.

(57) ABSTRACT

A voltage level conversion circuit includes a voltage switch circuit and a level shift circuit. The voltage switch circuit is configured to sequentially output an intermediate voltage and a conversion voltage in response to a switch signal. The level shift circuit is configured to latch a voltage level corresponding to an input signal using the intermediate voltage, and to convert the latched voltage level using the conversion voltage to generate an output signal.

15 Claims, 20 Drawing Sheets

VOLTAGE LEVEL CONVERSION CIRCUITS AND DISPLAY DEVICES INCLUDING THE SAME

CROSS-REFERENCE TO RELATED APPLICATION

This U.S. non-provisional application claims priority under 35 U.S.C. §119 to Korean Patent Application No. 10-2013-0019749, filed on Feb. 25, 2013, in the Korean Intellectual Property Office (KIPO), the disclosure of which is incorporated by reference in its entirety herein.

BACKGROUND

1. Technical Field

Example embodiments relate generally to semiconductor integrated circuits, and more particularly, to voltage level conversion circuits and/or display devices including voltage level conversion circuits.

2. Discussion of the Related Art

Semiconductor integrated circuits may include a plurality of function blocks, which operate based on different voltages. For example, a core block requiring a higher operational speed may be driven by a lower voltage and an input-output block may be driven by a higher voltage. A level shifter may be used to convert voltage levels of signals, which are transferred between the circuits driven by the different voltages.

The level shifter may include a voltage-down converter for generating an output signal having a decreased amplitude in comparison with an input signal, but generally the level shifter indicates a voltage-up converter having an increased amplitude. As the amplitude difference or the voltage level difference increases between the input signal and the output signal, the driving capacity of the level shifter may be insufficient to reflect the transition of the input signal to the transition of the output signal. For example, the level shifter may include a resistor on an internal current path to compensate for the insufficient driving capacity. In this case, the additional resistor may increase the size and power consumption of the level shifter significantly.

SUMMARY

Example embodiments of inventive concepts provide voltage level conversion circuits capable of performing a more stable level shifting operation, reducing occupation area and/or reducing power consumption.

Example embodiments of inventive concepts provide display devices including voltage level conversion circuits capable of performing a more stable level shifting operation, reducing occupation area and/or reducing power consumption.

According to example embodiments, a voltage level conversion circuit includes a voltage switch circuit and a level shift circuit. The voltage switch circuit is configured to sequentially output an intermediate voltage and a conversion voltage in response to a switch signal. The level shift circuit is configured to latch a voltage level corresponding to an input signal using the intermediate voltage, and to convert the latched voltage level using the conversion voltage to generate an output signal.

The voltage level conversion circuit may further include a switch signal generator configured to generate the switch signal based on an input control signal indicative of a transition timing of the input signal.

The switch signal may transition to a first switch voltage in response to the input control signal, and to a second switch voltage after a latch time interval.

The input signal may transition between a first voltage and a second voltage higher than the first voltage, and the output signal may transition between the first voltage and the conversion voltage higher than the second voltage.

The voltage switch circuit may include a first (e.g., P-type metal-oxide semiconductor (PMOS)) transistor and a second (e.g., PMOS) transistor. The first (e.g., PMOS) transistor may be coupled between the intermediate voltage and a voltage node, and a gate of the first (e.g., PMOS) transistor configured to receive the switch signal. The second (e.g., PMOS) transistor may be coupled between the conversion voltage and the voltage node, and a gate of the second (e.g., PMOS) transistor configured to receive an inverted version of the switch signal.

The level shift circuit may include: a third (e.g., PMOS) transistor coupled between the voltage node and a first node, a gate of the third (e.g., PMOS) transistor may be coupled to a second node that outputs the output signal; a fourth (e.g., PMOS) transistor coupled between the voltage node and the second node, a gate of the fourth (e.g., PMOS) transistor may be coupled to the first node; a fifth (e.g., N-type metal-oxide semiconductor (NMOS)) transistor coupled between the first node and the first voltage, a gate of the fifth (e.g., NMOS) transistor configured to receive the input signal; and a sixth (e.g., NMOS) transistor coupled between the second node and the first voltage, a gate of the sixth (e.g., NMOS) transistor configured to receive an inverted version of the input signal.

The intermediate voltage may include a first intermediate voltage and a second intermediate voltage higher than the first intermediate voltage. The conversion voltage may include a first conversion voltage lower than the first intermediate voltage and a second conversion voltage higher than the second intermediate voltage. The input signal may transition between a first voltage and a second voltage higher than the first voltage, and the output signal may transition between the first conversion voltage lower than the first voltage and the second conversion voltage higher than the second voltage.

The first intermediate voltage may be equal or substantially equal to the first voltage, and the second intermediate voltage may be equal or substantially equal to the second voltage.

The voltage switch circuit may include: a first voltage switch circuit configured to sequentially output a first intermediate voltage and a first conversion voltage lower than the first intermediate voltage to a first voltage node in response to the switch signal; and a second voltage switch circuit configured to sequentially output a second intermediate voltage and a second conversion voltage higher than the second intermediate voltage to a second voltage node in response to the switch signal.

The first voltage switch circuit may include: a first (e.g., NMOS) transistor coupled between the first intermediate voltage and the first voltage node, a gate of the first (e.g., NMOS) transistor being configured to receive an inverted version of the switch signal; and a second (e.g., NMOS) transistor coupled between the first conversion voltage and the first voltage node, a gate of the second (e.g., NMOS) transistor being configured to receive the switch signal.

The second voltage switch circuit may include: a third (e.g., PMOS) transistor coupled between the second intermediate voltage and the second voltage node, a gate of the third (e.g., PMOS) transistor being configured to receive the switch signal; and a fourth (e.g., PMOS) transistor coupled between the second conversion voltage and the second voltage node, a gate of the fourth (e.g., PMOS) transistor being configured to receive the inverted version of the switch signal.

The level shift circuit may include: a first level shift circuit coupled between the first voltage node and the second intermediate voltage, the first level shift circuit being configured to latch the voltage level corresponding to the input signal using the first intermediate voltage, and to convert the latched voltage level using the second intermediate voltage and the first conversion voltage to generate an intermediate signal transitioning between the second intermediate voltage and the first conversion voltage; and a second level shift circuit coupled between the second voltage node and the first conversion voltage, the second level shift circuit being configured to latch a voltage level corresponding to the intermediate signal using the second intermediate voltage, and to convert the latched voltage level corresponding to the intermediate signal using the first conversion voltage and the second conversion voltage to generate the output signal transitioning between the first conversion voltage and the second conversion voltage.

The level shift circuit may include: a first level shift circuit coupled between the first voltage node and the second intermediate voltage, the first level shift circuit being configured to latch the voltage level corresponding to the input signal using the first intermediate voltage, and to convert the latched voltage level using the second intermediate voltage and the first conversion voltage to generate a first intermediate signal transitioning between the second intermediate voltage and the first conversion voltage; a second level shift circuit coupled between the second voltage node and the first intermediate voltage, the second level shift circuit being configured to latch the voltage level corresponding to the input signal using the second intermediate voltage, and to convert the latched voltage level using the first intermediate voltage and the second conversion voltage to generate a second intermediate signal transitioning between the first intermediate voltage and the second conversion voltage; and a buffer circuit coupled between the first conversion voltage and the second conversion voltage, the buffer circuit being configured to generate the output signal transitioning between the first conversion voltage and the second conversion voltage in response to the first intermediate signal and the second intermediate signal.

According to example embodiments, a display device includes: a display panel including a plurality of pixels coupled to a plurality of source lines and a plurality of gate lines; a source driver configured to drive the plurality of source lines; a gate driver configured to drive the plurality of gate lines; and a timing controller configured to control the display panel, the source driver and the gate driver. At least one of the source driver and the gate driver includes a voltage level conversion circuit. The voltage level conversion circuit includes: a voltage switch circuit configured to sequentially output an intermediate voltage and a conversion voltage in response to a switch signal; and a level shift circuit configured to latch a voltage level corresponding to an input signal using the intermediate voltage, and to convert the latched voltage level using the conversion voltage to generate an output signal.

The voltage level conversion circuit may further include a switch signal generator configured to generate the switch signal based on a transition timing of the input signal.

The display device may include a plurality of level shift circuits commonly coupled to a single voltage switch circuit.

Example embodiments provide a voltage level conversion circuit including: a level shift circuit configured to latch an intermediate voltage during a latch time period in response to an input signal, the level shift circuit being further configured to, after expiration of the latch time period, generate an output signal by level shifting the latched intermediate voltage to a conversion voltage, a magnitude of the conversion voltage being greater than a magnitude of the intermediate voltage.

The voltage level conversion circuit may further include: a voltage switch circuit configured to sequentially output the intermediate voltage and the conversion voltage in response to a switch signal.

The voltage level conversion circuit may further include: a switch signal generator configured to generate the switch signal based on an input control signal indicative of a transition timing of the input signal.

Example embodiments provide a display device including: a display panel including a plurality of pixels coupled to a plurality of source lines and a plurality of gate lines; a source driver configured to drive the plurality of source lines; a gate driver configured to drive the plurality of gate lines; and a timing controller configured to control the display panel, the source driver and the gate driver. At least one of the source driver and the gate driver including a voltage level conversion circuit: voltage level conversion circuit including: a level shift circuit configured to latch an intermediate voltage during a latch time period in response to an input signal, the level shift circuit being further configured to, after expiration of the latch time period, generate an output signal by level shifting the latched intermediate voltage to a conversion voltage, a magnitude of the conversion voltage being greater than a magnitude of the intermediate voltage.

BRIEF DESCRIPTION OF THE DRAWINGS

Example embodiments of inventive concepts will be more clearly understood from the following detailed description taken in conjunction with the accompanying drawings.

DETAILED DESCRIPTION

Figure 1:
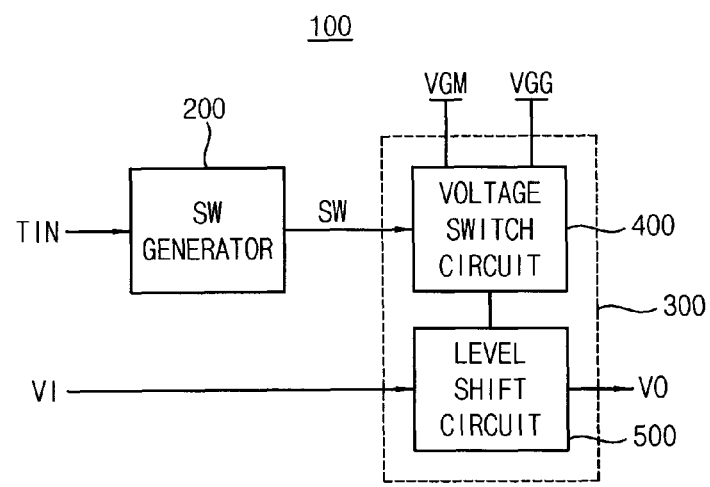
FIG. 1 is a block diagram illustrating a voltage level conversion circuit according to example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a voltage level conversion circuit according to example embodiments.

Referring to FIG. 1, a voltage level conversion circuit 100 may include a voltage switch circuit 400 and a level shift circuit 500. The voltage switch circuit 400 and the level shift circuit 500 may be referred to as a level shifter 300.

The voltage switch circuit 400 may provide an intermediate voltage VGM and a conversion voltage VGG to the level shift circuit 500 sequentially in response to a switch signal SW. The intermediate voltage VGM and the conversion voltage VGG may be positive voltages or negative voltages according to example embodiments. In case of the positive voltages, the intermediate voltage VGM is higher than a ground voltage, i.e., 0V, and the conversion voltage VGG is higher than the intermediate voltage VGM. In case of the negative voltages, the intermediate voltage VGM is lower than the ground voltage and the conversion voltage VGG is lower than the intermediate voltage VGM.

In some example embodiments as will be described with reference to FIGS. 7 through 13, the intermediate voltage may include a first intermediate voltage VEM and a second intermediate voltage VGM, and the conversion voltage may include a first conversion voltage VEE and a second conversion voltage VGG.

The level shift circuit 500 receives the intermediate voltage VGM and the conversion voltage VGG sequentially from the voltage switch circuit 400. The level shift circuit 500 may latch a voltage level corresponding to an input signal VI using the intermediate voltage VGM and then convert the latched voltage level using the conversion voltage VGG to generate an output signal VO. In other words, the level shift circuit 500 may perform a latch operation with respect to the input signal VI based on the intermediate voltage VGM firstly and then perform a level shifting operation with respect to the latched voltage level based on the conversion voltage VGM.

As illustrated in FIG. 1, the voltage level conversion circuit 100 may further include a switch signal generator 200 that generates the switch signal SW based on an input control signal TIN. The input control signal TIN may indicate a transition timing of the input signal VI. According to example embodiments, the input control signal TIN may be a signal distinct from the input signal VI or the input signal VI itself may be used as the input control signal TIN.

Figure 2:
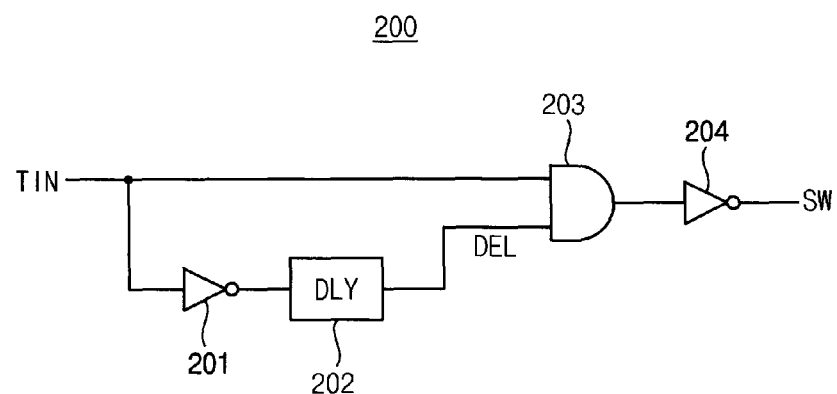
FIG. 2 is a circuit diagram illustrating an example embodiment of a switch signal generator in the voltage level conversion circuit of FIG. 1.
Figure 3:
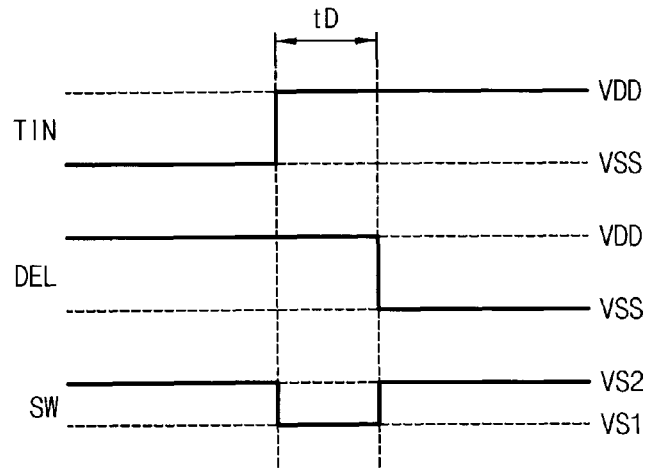
FIG. 3 is a timing diagram illustrating example operation of the switch signal generator of FIG. 2.

FIG. 2 is a circuit diagram illustrating an example embodiment of a switch signal generator in the voltage level conversion circuit of FIG. 1, and FIG. 3 is a timing diagram illustrating an operation of the switch signal generator of FIG. 2.

Referring to FIG. 2, a switch signal generator 200 may include a first inverter 201, a delay element (DLY) 202, a logic gate 203 and a second inverter 204. The first inverter 201 inverts the input control signal TIN and the delay element 202 delays the output signal of the first inverter 201 by a given, desired or predetermined delay time to output a delay signal DEL. The logic gate 203 may be implemented with an AND logic gate that performs an AND logic on the input control signal TIN and the delay signal DEL to output a pulse signal. The second inverter 204 inverts the output pulse signal of the logic gate 203 and outputs the switch signal SW.

Referring to FIG. 3, the input control signal TIN may transition between a first voltage VSS and a second voltage VDD. The first voltage VSS and the second voltage VDD may be a ground voltage and a power supply voltage of a circuit block or a device that provides the input signal VI and the input control signal TIN.

The switch signal SW may transition to a first switch voltage VS1 at a rising edge of the input control signal TIN and transitions to a second switch voltage VS2 after the delay time tD. The delay time tD may be determined by adjusting the delay amount of the delay element 202 and the delay time tD may correspond to a latch time as will be described below. The voltage levels VS1 and VS2 of the switch signal SW may be determined by setting the operational voltages of the switch signal generator 200 to the first and second switch voltages VS1 and VS2. The first switch voltage VS1 may be the ground voltage or the first voltage VSS and the second switch voltage VS2 may be the intermediate voltage VGM or the conversion voltage VGG.

As such, through the example configuration of the switch signal generator 200 as illustrated in FIG. 2, the switch signal SW may transition to the first switch voltage VS1 in response to the input control signal TIN and then transition to the second switch voltage VS2 after the latch time tD.

Hereinafter, an example embodiment of the voltage level conversion circuit 100 is described with reference to FIGS. 4 and 5 for a case that the input signal VI transitions between a first voltage VSS and a second voltage VDD higher than the first voltage VSS, and the output signal VO transitions between the first voltage VSS and the conversion voltage VGG higher than the second voltage VDD. In this case, the low voltage level of the input signal VI and the output signal VO are fixed to the first voltage VSS and the high voltage level is shifted from the second voltage VDD of the input signal VI to the conversion voltage VGG of the output signal VO. The first voltage VSS and the second voltage VDD may be the power voltages of the circuit block providing the input signal VI and the first voltage VSS may be the ground voltage.

Figure 4:
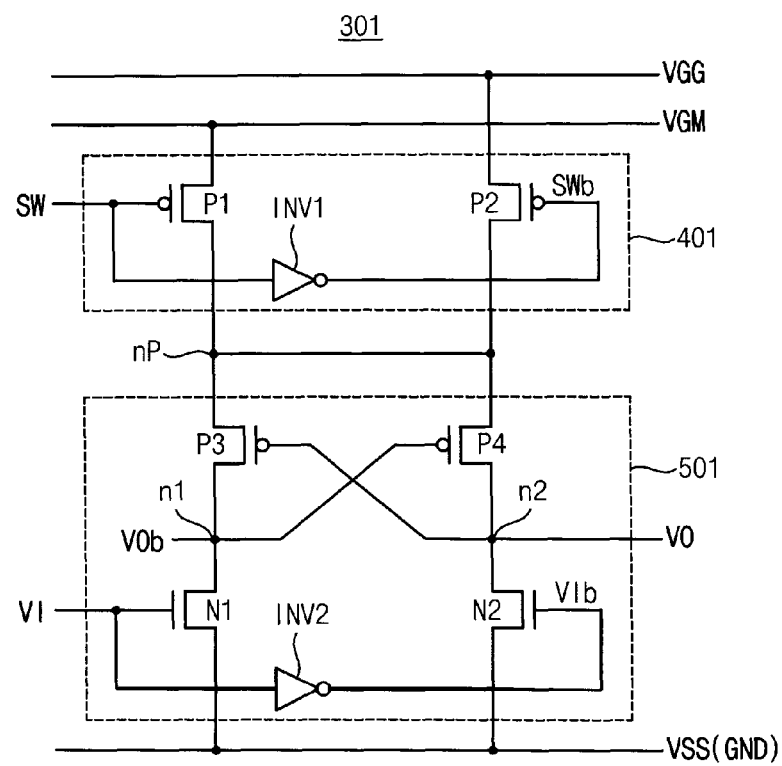
FIG. 4 is a circuit diagram illustrating an example embodiment of a level shifter in the voltage level conversion circuit of FIG. 1.

FIG. 4 is a circuit diagram illustrating an example embodiment of a level shifter in the voltage level conversion circuit of FIG. 1.

Referring to FIG. 4, a level shifter 301 may include a voltage switch circuit 401 coupled between a voltage node nP, an intermediate voltage VGM and a conversion voltage VGG, and a level shift circuit 501 coupled between the voltage node nP and a first voltage VSS.

The voltage switch circuit 401 may include a first P-type metal-oxide semiconductor (PMOS) transistor P1 and a second PMOS transistor P2. The first PMOS transistor P1 is coupled between the intermediate voltage VGM and the voltage node nP, and a gate of the first PMOS transistor P1 receives the switch signal SW. The second PMOS transistor P2 is coupled between the conversion voltage VGG and the voltage node nP, and a gate of the second PMOS transistor P2 receives an inversion signal SWb of the switch signal SW. The voltage switch circuit 401 may further include an inverter INV1 for providing the inversion signal SWb by inverting the switch signal SW.

The switch signal SW has relatively a lower voltage level, e.g., a first switch voltage VS1, during a latch time tD so that the first PMOS transistor P1 may be turned on and the second PMOS transistor P2 may be turned off. As a result, the intermediate voltage VGM may be applied to the voltage node nP during the latch time tD. After the latch time tD, the switch signal SW transitions to relatively a higher voltage level, e.g., a second switch voltage VS2 so that the second PMOS transistor P2 may be turned on and the first PMOS transistor P1 may be turned off. As a result, the conversion voltage VGG may be applied to the voltage node nP after the latch time tD. As such, the voltage switch circuit 401 may provide the intermediate voltage VGM and the conversion voltage VGG sequentially through the complementary switching operation of the first and second PMOS transistors P1 and P2.

The level shift circuit 501 may include a third PMOS transistor P3, a fourth PMOS transistor P4, a first N-type metal-oxide semiconductor (NMOS) transistor N1 and a second NMOS transistor N2.

The third PMOS transistor P3 is coupled between the voltage node nP and a first node n1, and a gate of the third PMOS transistor P3 is coupled to a second node n2. The fourth PMOS transistor P4 is coupled between the voltage node nP and the second node n2, and a gate of the fourth PMOS transistor P4 is coupled to the first node n1. The first NMOS transistor N1 is coupled between the first node n1 and the first voltage VSS, and a gate of the first NMOS transistor N1 receives the input signal VI. The second NMOS transistor N2 is coupled between the second node n2 and the first voltage VSS, and a gate of the second NMOS transistor N2 receives an inversion signal VIb of the input signal VI. The output signal VO may be generated at the second node n2 and an inversion output signal VOb may be generated at the first node n1. The level shift circuit 501 may further include an inverter INV2 for providing the inversion signal VIb by inverting the input signal VI.

Figure 5:
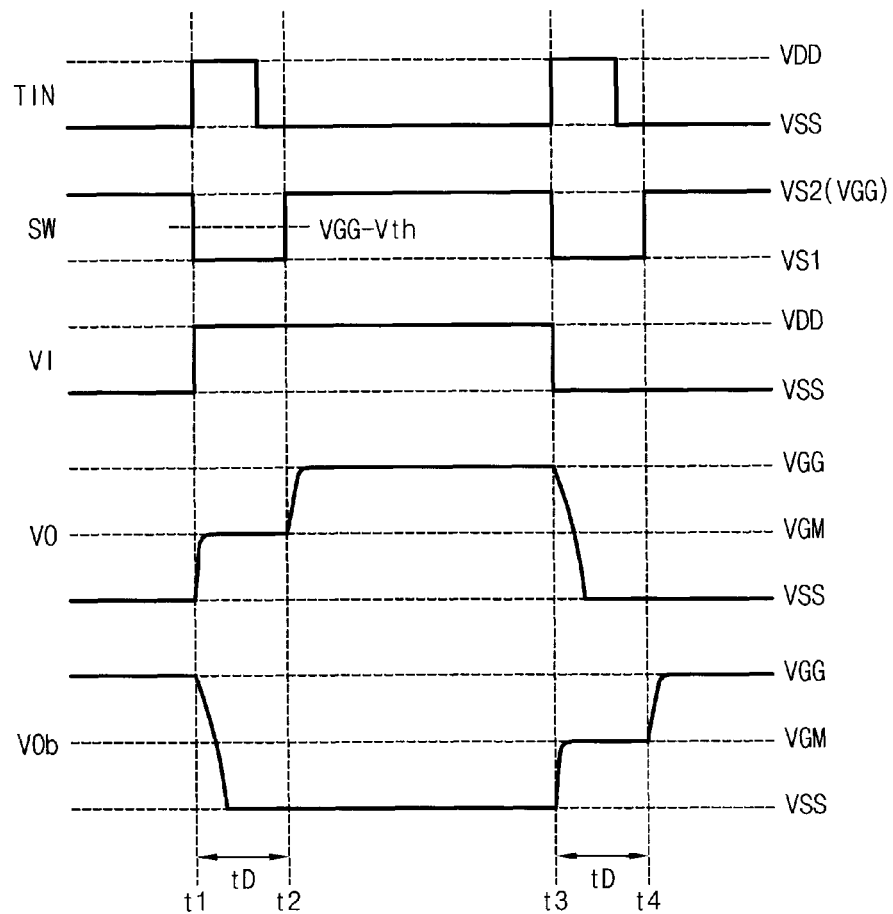
FIG. 5 is a timing diagram illustrating an operation of the level shifter of FIG. 4.

FIG. 5 is a timing diagram illustrating an operation of the level shifter of FIG. 4.

Referring FIGS. 4 and 5, the input control signal TIN may be a pulse signal that is activated at time points t1 and t3 when the input signal VI transitions. The switch signal SW may transition from the second switch voltage VS2 to the first switch voltage VS1 in synchronization with the rising edges of the input control signal TIN and maintain the first voltage VS1 during the latch time tD.

At time point t1, the switch signal SW transitions from the second switch voltage VS2 to the first switch voltage VS1 in response to the input control signal TIN. The first PMOS transistor P1 is turned on, the second PMOS transistor P2 is turned off and thus the intermediate voltage VGM is applied to the voltage node nP. The second switch voltage VS2 may correspond to the conversion voltage VGG and the first switch voltage VS1 may be determined to a proper voltage level considering the threshold voltage Vth of the PMOS transistors P1 and P2 in the voltage switch circuit 401.

During time interval t1 to t2, the level shift circuit 501 performs a latch operation with respect to the input signal VI based on the intermediate voltage VGM. For example, the level shift circuit 501 latches the logic high value corresponding to the voltage level of the input signal VI. As a result, the output signal VO transitions to and maintains the intermediate voltage VGM and the inversion output signal VOb transitions to and maintains the first voltage VSS during the latch time tD, that is, the time interval t1 to t2.

At time point t2 after the latch time tD, the switch signal SW transitions from the first switch voltage VS1 to the second switch voltage VS2. The first PMOS transistor P1 is turned off, the second PMOS transistor P2 is turned on and thus the conversion voltage VGG is applied to the voltage node nP.

After time point t2, the level shift circuit 501 performs a level shifting operation based on the latched voltage level and the conversion voltage VGG. The output signal VO transitions from the intermediate voltage VGM to the conversion voltage VGG and the inversion output signal VOb maintains the first voltage VSS.

At time point t3, the switch signal SW transitions from the second switch voltage VS2 to the first switch voltage VS1 in response to the input control signal TIN. The first PMOS transistor P1 is turned on, the second PMOS transistor P2 is turned off and thus the intermediate voltage VGM is applied to the voltage node nP.

During time interval t3 to t4, the level shift circuit 501 performs the latch operation with respect to the input signal VI based on the intermediate voltage VGM. For example, the level shift circuit 501 latches the logic low value corresponding to the voltage level of the input signal VI. As a result, the output signal VO transitions to and maintains the first voltage VSS and the inversion output signal VOb transitions to and maintains the intermediate voltage VGM during the latch time tD.

At time point t4 after the latch time tD, the switch signal SW transitions from the first switch voltage VS1 to the second switch voltage VS2. The first PMOS transistor P1 is turned off, the second PMOS transistor P2 is turned on and thus the conversion voltage VGG is applied to the voltage node nP.

After time point t4, the level shift circuit 501 performs the level shifting operation based on the latched voltage level and the conversion voltage VGG. The output signal VO maintains the first voltage VSS and the inversion output signal VOb transitions from the intermediate voltage VGM to the conversion voltage VGG.

As such, the voltage level conversion circuit 100 may perform the latch operation during the latch time tD, that is, the time intervals t1 to t2 and t3 to t4, based on the intermediate voltage VGM and after the latch time tD, the voltage level conversion circuit 100 may perform the level shifting operation based on the conversion voltage VGG.

Through such step by step conversion, that is, the sequential latch and level shifting operations, the second voltage VDD of the input signal VI may be shifted stably to the conversion voltage VGG of the output signal VO via the intermediate voltage VGM. The resistor for increasing the voltage conversion range in the conventional scheme may be substitute with the voltage switch circuit 401 of the smaller size and thus the occupation area of the voltage level conversion circuit 100 may be reduced.

Figure 6:
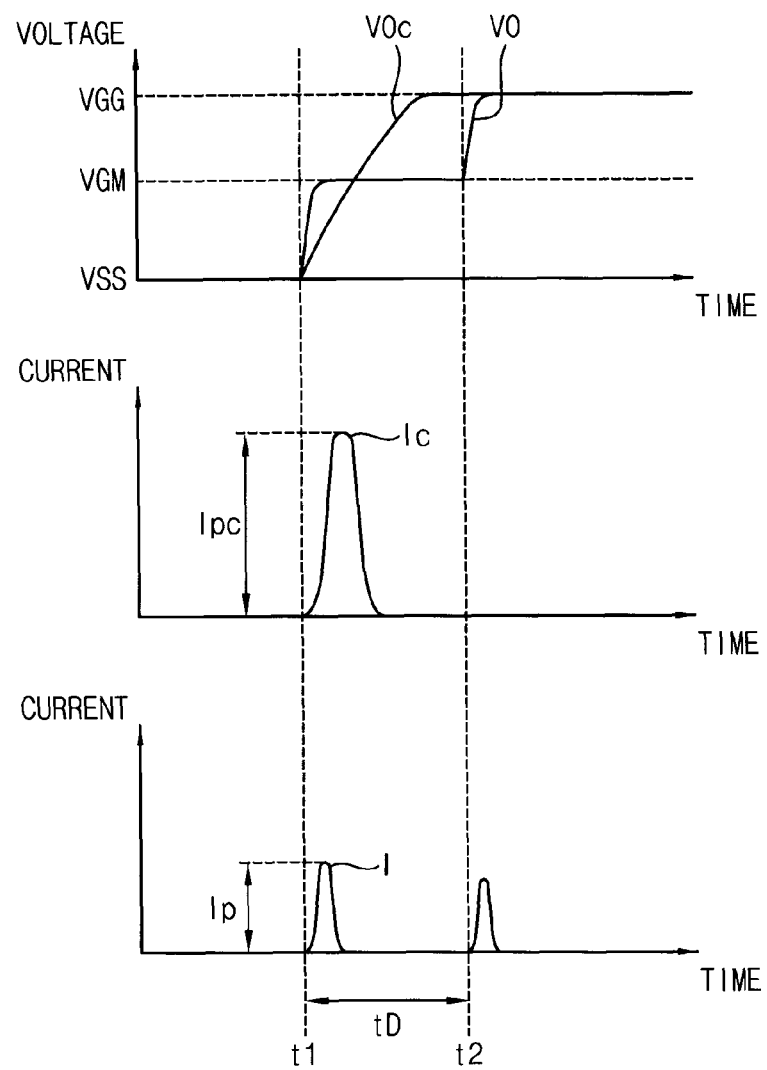
FIG. 6 is a diagram for describing an example operational current of a voltage level conversion circuit according to example embodiments.

FIG. 6 is a diagram for describing an operational current of a voltage level conversion circuit according to example embodiments.

FIG. 6 illustrates an output signal VO and an operational current I of the voltage level conversion circuit 100 according to an example embodiment and an output signal VOc and an operational current Ic of a conventional level shifter.

Referring to FIG. 6, the voltage level conversion circuit 100 generates the output signal VO that transitions sequentially to the intermediate voltage VGM then to the conversion voltage VGG, whereas the conventional level shifter generates the output signal VOc that transitions directly to the conversion voltage VGG. Accordingly the peak value Ip of the operational current I in the voltage level conversion circuit 100 is smaller than the peak value Ipc of the operational current Ic in the conventional level shifter. Through the decrease of the peak value, the power consumption may be reduced in the voltage level conversion circuit 100 and devices using the voltage level conversion circuit 100. Also the decrease of the peak value may reduce noises of the output signal VO by preventing the operational voltage from being disturbed due to the excessive peak current.

Hereinafter, an example embodiment of the voltage level conversion circuit 100 is described with reference to FIGS. 7 and 13 for a case that the input signal VI transitions between a first voltage VSS and a second voltage VDD higher than the first voltage VSS, and the output signal VO transitions between a first conversion voltage VEE lower than the first voltage VSS and a second conversion voltage VGG higher than the second voltage VDD. In this case, the above-mentioned intermediate voltage includes a first intermediate voltage VEM and a second intermediate voltage VGM higher than the first intermediate voltage VEM, and the above-mentioned conversion voltage includes the first conversion voltage VEE lower than the first intermediate voltage VEM and the second conversion voltage VGG higher than the second intermediate voltage VGM. The first voltage VSS and the second voltage VDD may be the power voltages of the circuit block providing the input signal VI. The first intermediate voltage VEM may be equal to or lower than the first voltage VSS and the second intermediate voltage VGM may be equal to or higher than the second voltage VDD. The first voltage VSS may be the ground voltage (that is, 0V) and the first conversion voltage VEE may be a negative voltage. In an example embodiment, the first intermediate voltage may be the ground voltage as the first voltage, and the second intermediate voltage VGM may be the power supply voltage as the second voltage VDD.

Figure 7:
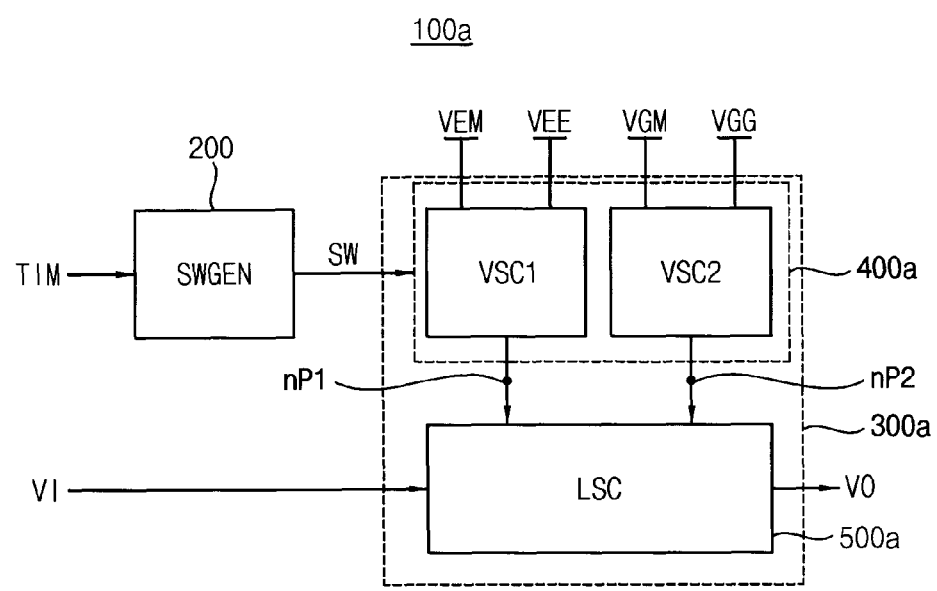
FIG. 7 is a block diagram illustrating a voltage level conversion circuit according to example embodiments.

FIG. 7 is a block diagram illustrating a voltage level conversion circuit according to example embodiments.

Referring to FIG. 7, a voltage level conversion circuit 100a may include a voltage switch circuit (LSC) 400a and a level shift circuit 500a. The voltage switch circuit 400a and the level shift circuit 500a may be referred to as a level shifter 300a.

The voltage switch circuit 400a may include a first voltage switch circuit VSC1 and a second voltage switch circuit VSC2. The first voltage switch circuit VSC1 may provide a first intermediate voltage VEM and a first conversion voltage VEE lower than the first intermediate voltage VEM to a first voltage node nP1 sequentially in response to the switch signal SW. The second voltage switch circuit VSC2 may provide a second intermediate voltage VGM and a second conversion voltage VGG higher than the second intermediate voltage VGM to a second voltage node nP2 sequentially in response to the switch signal SW.

The level shift circuit 500a receives the intermediate voltages VEM and VGM and the conversion voltages VEE and VGG sequentially from the voltage switch circuit 400a. The level shift circuit 500a may latch a voltage level corresponding to the input signal VI using the intermediate voltages VEM and VGM and then convert the latched voltage level using the conversion voltages VEE and VGG to generate the output signal VO. In other words, the level shift circuit 500a may perform a latch operation with respect to the input signal VI based on the intermediate voltages VEM and VGM firstly and then perform a level shifting operation with respect to the latched voltage level based on the conversion voltages VEE and VGM.

As illustrated in FIG. 7, the voltage level conversion circuit 100a may further include a switch signal generator 200 that generates the switch signal SW based on an input control signal TIN. The input control signal TIN may indicate a transition timing of the input signal VI.

Figure 8:
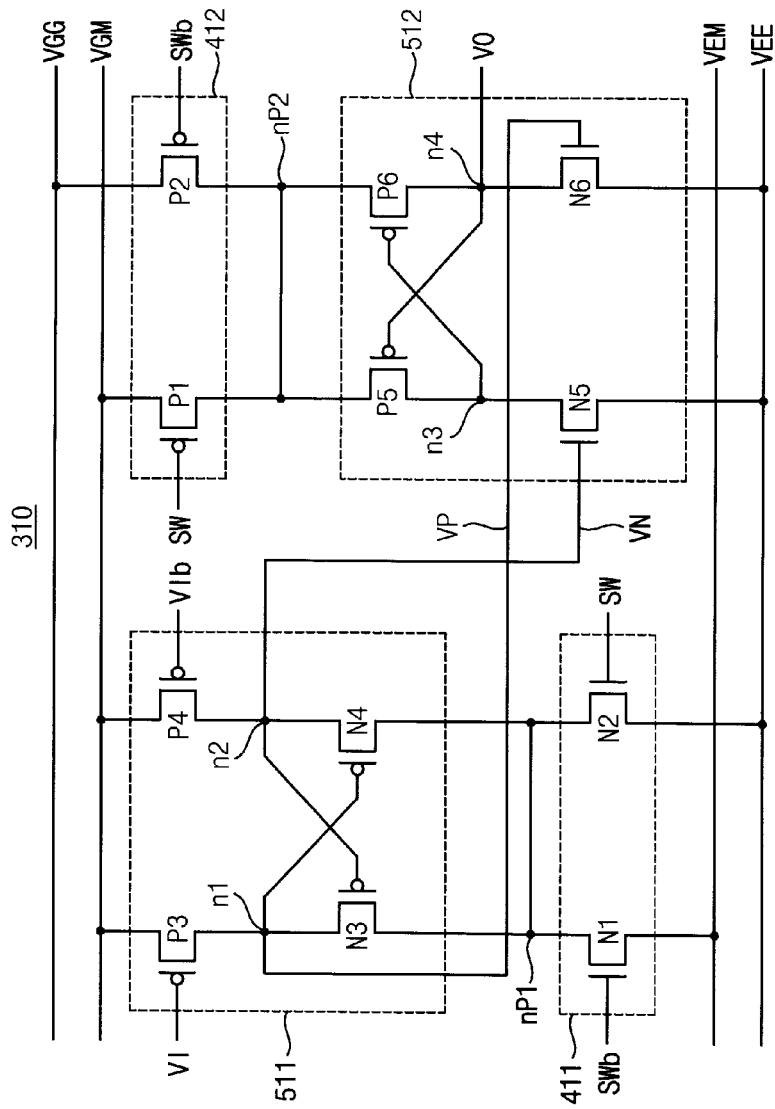
FIG. 8 is a circuit diagram illustrating an example embodiment of a level shifter in the voltage level conversion circuit of FIG. 7.

FIG. 8 is a circuit diagram illustrating an example embodiment of a level shifter in the voltage level conversion circuit of FIG. 7.

Referring to FIG. 8, a level shifter 310 may include a first voltage switch circuit 411, a second voltage switch circuit 412, a first level shift circuit 511 and a second level shift circuit 512.

The first voltage switch circuit 411 may include a first NMOS transistor N1 and a second NMOS transistor N2. The first NMOS transistor N1 is coupled between the first intermediate voltage VEM and the first voltage node nP1, and a gate of the first NMOS transistor N1 receives an inversion signal SWb of the switch signal SW. The second NMOS transistor N2 is coupled between the first conversion voltage VEE and the first voltage node nP1, and a gate of the second NMOS transistor N2 receives the switch signal SW.

The second voltage switch circuit 412 may include a first PMOS transistor P1 and a second PMOS transistor P2. The first PMOS transistor P1 is coupled between the second intermediate voltage VGM and the second voltage node nP2, and a gate of the first PMOS transistor P1 receives the switch signal SW. The second PMOS transistor P2 is coupled between the second conversion voltage VGG and the second voltage node nP2, and a gate of the second PMOS transistor P2 receives the inversion signal SWb of the switch signal SW.

The first level shift circuit 511 is coupled between the first voltage node nP1 and the second intermediate voltage VGM. The first level shift circuit may include a third NMOS transistor N3, a fourth NMOS transistor N4, a third PMOS transistor P3 and a fourth PMOS transistor P4, The third NMOS transistor N3 is coupled between the first voltage node nP1 and a first node n1 and a gate of the third NMOS transistor N3 is coupled to a second node n2. The fourth NMOS transistor N4 is coupled between the first voltage node nP1 and the second node n2 and a gate of the fourth NMOS transistor N4 is coupled to the first node n1. The third PMOS transistor P3 is coupled between the first node n1 and the second intermediate voltage VGM and a gate of the third PMOS transistor P3 receives the input signal VI. The fourth PMOS transistor P4 is coupled between the second node n2 and the second intermediate voltage VGM and a gate of the fourth PMOS transistor P4 receives an inversion signal VIb of the input signal VI. A positive intermediate signal VP is generated at the first node n1 and a negative intermediate signal VN is generated at the second node n2.

The second level shift circuit 512 is coupled between the second voltage node nP2 and the first conversion voltage VEE. The second level shift circuit 512 may include a fifth PMOS transistor P5, a sixth PMOS transistor P6, a fifth NMOS transistor N5 and a sixth NMOS transistor N6.

The fifth PMOS transistor P5 is coupled between the second voltage node nP2 and a third node n3 and a gate of the fifth PMOS transistor P5 is coupled to a fourth node n4. The sixth PMOS transistor P6 is coupled between the second voltage node nP2 and the fourth node n4 and a gate of the sixth PMOS transistor P6 is coupled to the third node n3. The fifth NMOS transistor N5 is coupled between the third node n3 and the first conversion voltage VEE and a gate of the fifth NMOS transistor N5 receives the negative intermediate voltage VN. The sixth NMOS transistor N6 is coupled between the fourth node n4 and the first conversion voltage VEE and a gate of the sixth NMOS transistor N6 receives the positive intermediate signal VP. The output signal VO is generated at the fourth node n4.

The first level shift circuit 511 latches the voltage level corresponding to the input signal VI using the first intermediate voltage VEM and then converts the latched voltage level using the second intermediate voltage VGM and the first conversion voltage VEE to generate the intermediate signals VP and VN transitioning between the second intermediate voltage VGM and the first conversion voltage VEE. The second level shift circuit 512 latches a voltage level corresponding to the intermediate signals VP and VN using the second intermediate voltage VGM and then converts the latched voltage level using the first conversion voltage VEE and the second conversion voltage VGG to generate the output signal VO transitioning between the first conversion voltage VEE and the second conversion voltage VGG.

Figure 9:
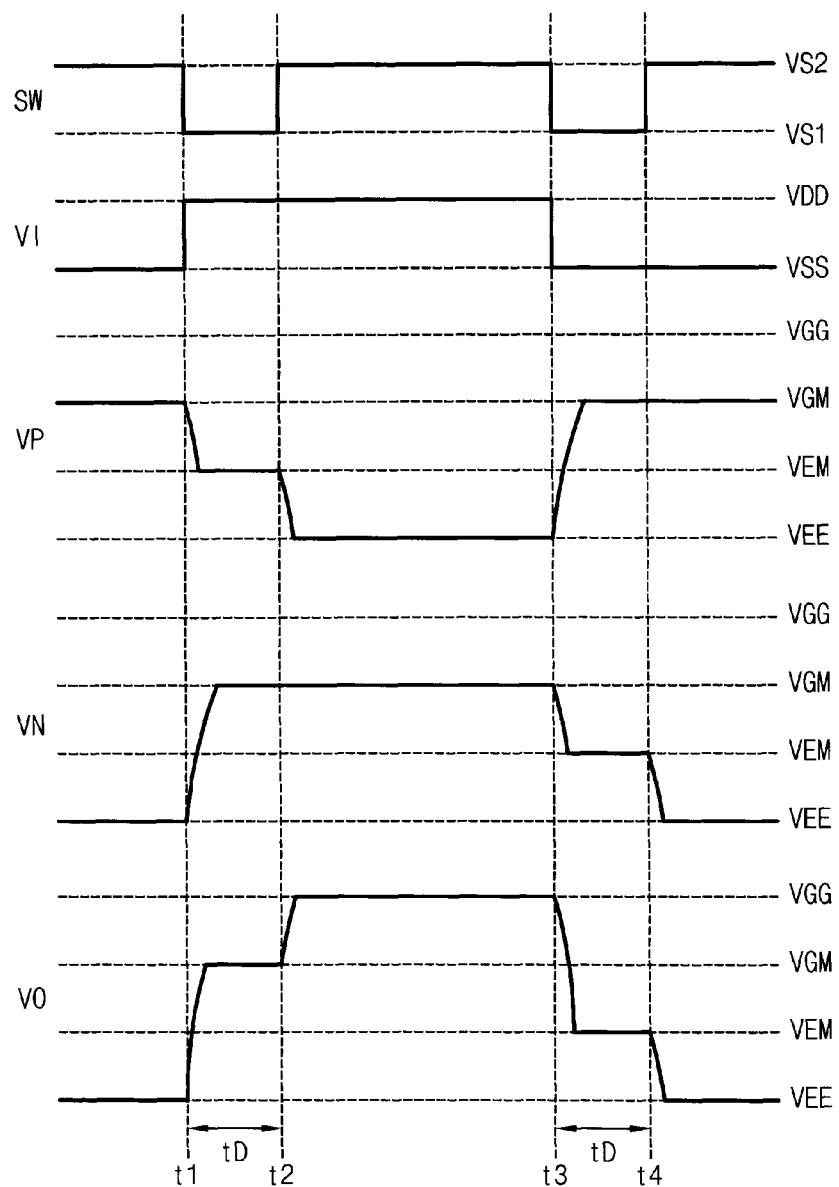
FIG. 9 is a timing diagram illustrating example operation of the level shifter of FIG. 8.

FIG. 9 is a timing diagram illustrating an operation of the level shifter of FIG. 8.

Referring to FIGS. 8 and 9, the switch signal SW may transition from the second switch voltage VS2 to the first switch voltage VS1 in synchronization with the transition timing of the input signal VI and maintain the first voltage VS1 during the latch time tD.

At time point t1, the switch signal SW transitions from the second switch voltage VS2 to the first switch voltage VS1. The first NMOS transistor N1 is turned on, the second NMOS transistor N2 turned off and thus the first intermediate voltage VEM is applied to the first voltage node nP1. At the same time, the first PMOS transistor P1 is turned on, the second PMOS transistor P2 is turned off and thus the second intermediate voltage VGM is applied to the second voltage node nP2.

During time interval t1 to t2, the first level shift circuit 511 performs a latch operation with respect to the input signal VI based on the first intermediate voltage VEM, and the second level shift circuit 512 performs the latch operation with respect to the intermediate signals VP and VN based on the second intermediate voltage VGM. For example, the first level shift circuit 511 latches the logic high value corresponding to the voltage level of the input signal VI, and the second level shift circuit 512 latches the voltage levels corresponding to the intermediate signal VP and VN. As a result, the positive intermediate signal VP transitions to and maintains the first intermediate voltage VEM, the negative intermediate signal VN transitions to and maintains the second intermediate voltage VGM, and the output signal VO transitions to and maintains the second intermediate voltage VGM during the latch time tD, that is, the time interval t1 to t2.

At time point t2 after the latch time tD, the switch signal SW transitions from the first switch voltage VS1 to the second switch voltage VS2. The first NMOS transistor N1 is turned off, the second NMOS transistor N2 turned on and thus the first conversion voltage VEE is applied to the first voltage node nP1. At the same time, the first PMOS transistor P1 is turned off, the second PMOS transistor P2 is turned on and thus the second conversion voltage VGG is applied to the second voltage node nP2.

After time point t2, the first level shift circuit 511 performs a level shifting operation based on its latched value and the first conversion voltage VEE, and the second level shift circuit 512 performs the level shifting operation based on its latched value and the second conversion voltage VGG. As a result, the positive intermediate signal VP transitions to and maintains the first conversion voltage VEE, the negative intermediate signal VN transitions to and maintains the second intermediate voltage VGM and the output signal VO transitions from the second intermediate voltage VGM to the second conversion voltage VGG.

At time point t3, the switch signal SW transitions from the second switch voltage VS2 to the first switch voltage VS1. The first NMOS transistor N1 is turned on, the second NMOS transistor N2 turned off and thus the first intermediate voltage VEM is applied to the first voltage node nP1. At the same time, the first PMOS transistor P1 is turned on, the second PMOS transistor P2 is turned off and thus the second intermediate voltage VGM is applied to the second voltage node nP2.

During time interval t3 to t4, the first level shift circuit 511 performs the latch operation with respect to the input signal VI based on the first intermediate voltage VEM, and the second level shift circuit 512 performs the latch operation with respect to the intermediate signals VP and VN based on the second intermediate voltage VGM. As a result, the positive intermediate signal VP transitions to and maintains the second intermediate voltage VGM, the negative intermediate signal VN transitions to and maintains the first intermediate voltage VEM, and the output signal VO transitions to and maintains the first intermediate voltage VEM during the latch time tD, that is, the time interval t3 to t4.

At time point t4 after the latch time tD, the switch signal SW transitions from the first switch voltage VS1 to the second switch voltage VS2. The first NMOS transistor N1 is turned off, the second NMOS transistor N2 turned on and thus the first conversion voltage VEE is applied to the first voltage node nP1. At the same time, the first PMOS transistor P1 is turned off, the second PMOS transistor P2 is turned on and thus the second conversion voltage VGG is applied to the second voltage node nP2.

After time point t4, the first level shift circuit 511 performs the level shifting operation based on its latched value and the first conversion voltage VEE, and the second level shift circuit 512 performs the level shifting operation based on its latched value and the second conversion voltage VGG. As a result, the positive intermediate signal VP maintains the second intermediate voltage VGM, the negative intermediate signal VN transitions to and maintains the first conversion voltage VEE and the output signal VO transitions from the first intermediate voltage VEM to the first conversion voltage VEE.

As such, the level shifter 310 may perform the latch operation during the latch time tD, that is, the time intervals t1 to t2 and t3 to t4, based on the intermediate voltages VEM and VGM and after the latch time tD, the level shifter 310 may perform the level shifting operation based on the conversion voltages VEE and VGG.

Through such step by step conversion, that is, the sequential latch and level shifting operations, the voltage levels VSS and VDD of the input signal VI may be shifted stably to the conversion voltages VEE and VGG of the output signal VO via the intermediate voltages VEM and VGM. The resistor for increasing the voltage conversion range in the conventional scheme may be substitute with the voltage switch circuits 411 and 412 of the smaller size and thus the occupation area of the voltage level conversion circuit 100a may be reduced.

Figure 10:
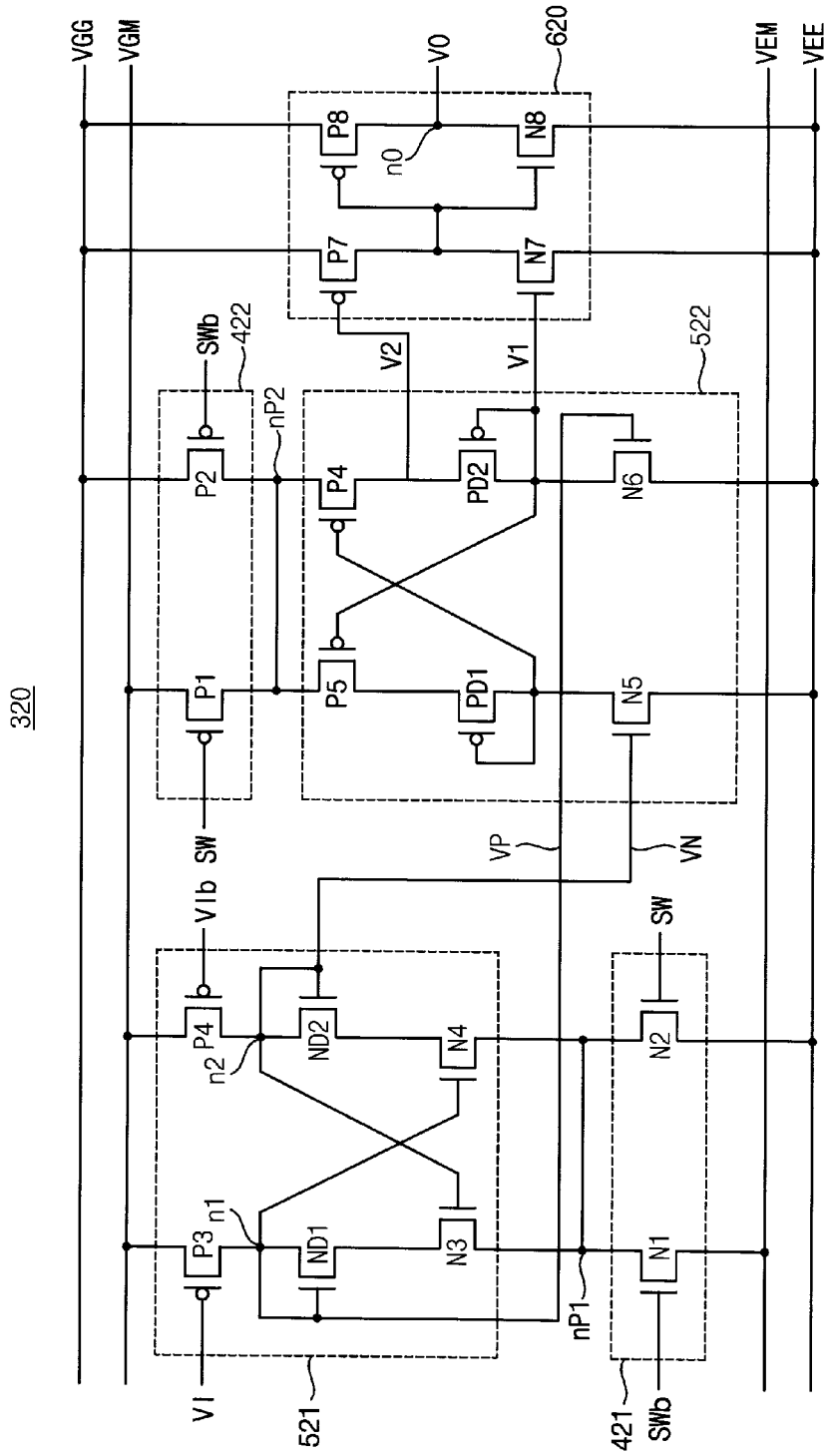
FIG. 10 is a circuit diagram illustrating another example embodiment of a level shifter in the voltage level conversion circuit of FIG. 7.
Figure 11:
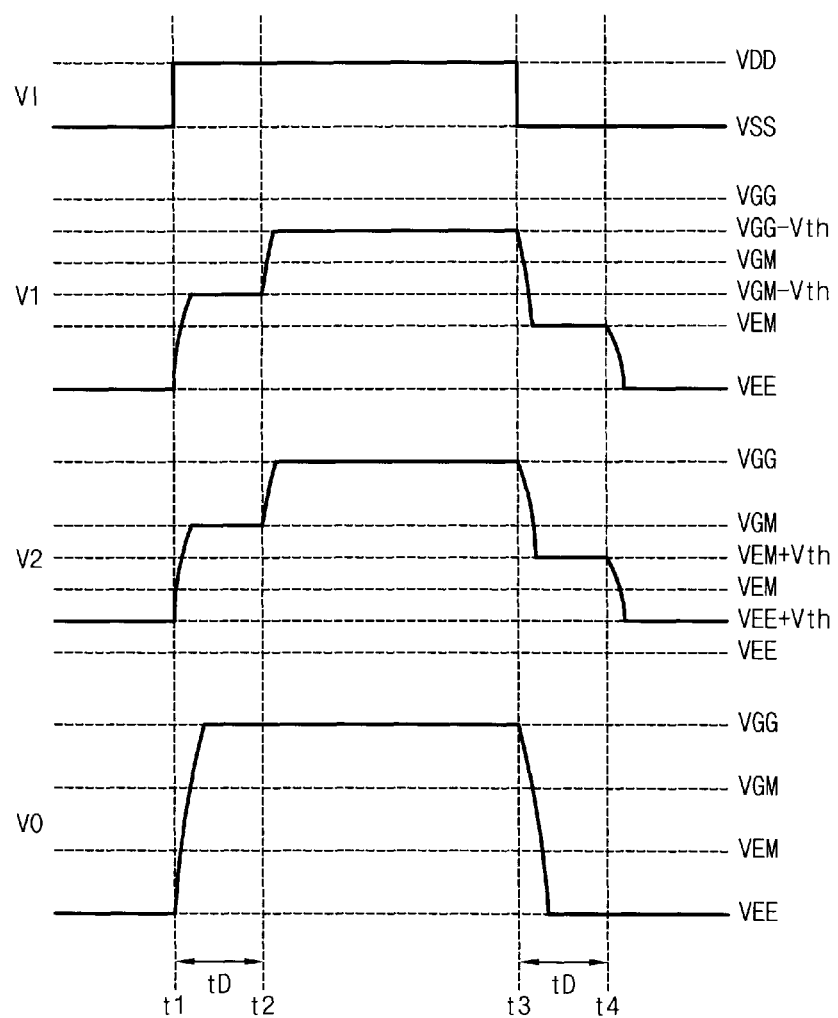
FIG. 11 is a timing diagram illustrating example operation of the level shifter of FIG. 10.

FIG. 10 is a circuit diagram illustrating another example embodiment of a level shifter in the voltage level conversion circuit of FIG. 7, and FIG. 11 is a timing diagram illustrating an operation of the level shifter of FIG. 10. The repeated descriptions with FIGS. 8 and 9 may be omitted.

Referring FIG. 10, a level shifter 320 may include a first voltage switch circuit 421, a second voltage switch circuit 422, a first level shift circuit 521, a second level shift circuit 522 and a buffer circuit 620.

The configuration and the operation of the voltage switch circuits 421 and 422 are the same as described with reference to FIGS. 8 and 9. Compared with the level shift circuits 511 and 512 in FIG. 8, the level shift circuits 521 and 522 in FIG. 10 further include diode-coupled transistors ND1, ND2, PD1 and PD2.

The buffer circuit may include a first inverter P7 and N7 and a second inverter P8 and N8 that generate the output signal VO based on a first signal V1 and V2.

Referring to FIGS. 10 and 11, as described above, the level shifter 320 may perform the latch operation during the latch time tD, that is, the time intervals t1 to t2 and t3 to t4, based on the intermediate voltages VEM and VGM and after the latch time tD, the level shifter 320 may perform the level shifting operation based on the conversion voltages VEE and VGG.

The first signal V1 corresponds to a drain voltage of the diode-coupled PMOS transistor PD2 and the second signal V2 corresponds to a source voltage of the diode-coupled PMOS transistor PD2. The first signal V1 does not transition fully to the second conversion voltage VGG and a maximum voltage level of the first signal V1 is limited to the lower voltage VGG-Vth where Vth is the threshold voltage of the diode-coupled PMOS transistor PD2. Also the second signal V2 does not transition fully to the first conversion voltage VEE and a minimum voltage level of the second signal V2 is limited to the higher voltage VEE+Vth.

The buffer circuit 620 may further amplify the first and second signals V1 and V2, which have the reduced swing ranges, to generate the output signal VO that transitions fully between the first conversion voltage VEE and the second conversion voltage VGG. The peak current value of the level shifter 320 may be further decreased using the intermediate signals V1 and V2 having the reduced swing ranges.

Figure 12:
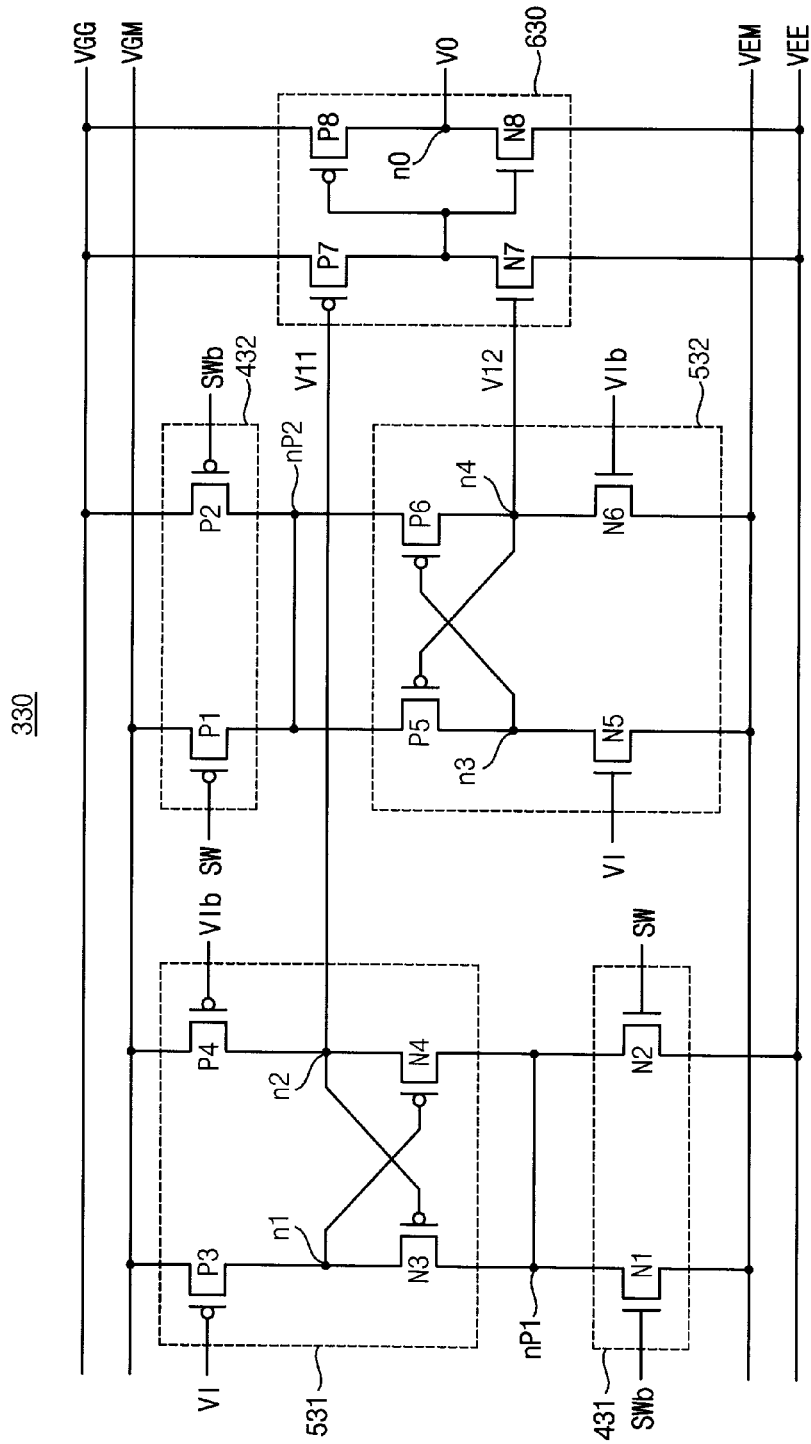
FIG. 12 is a circuit diagram illustrating still another example embodiment of a level shifter in the voltage level conversion circuit of FIG. 7.
Figure 13:
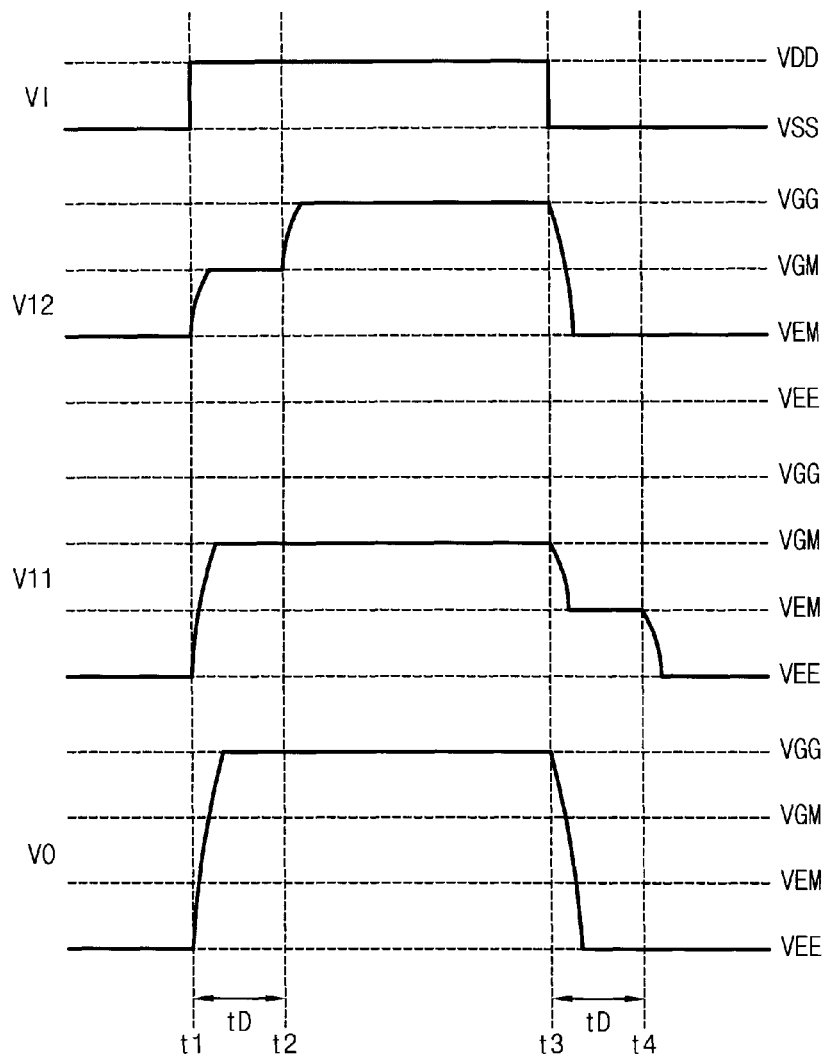
FIG. 13 is a timing diagram illustrating example operation of the level shifter of FIG. 12.

FIG. 12 is a circuit diagram illustrating still another example embodiment of a level shifter in the voltage level conversion circuit of FIG. 7, and FIG. 13 is a timing diagram illustrating an operation of the level shifter of FIG. 12.

Referring to FIG. 12, a level shifter 330 may include a first voltage switch circuit 431, a second voltage switch circuit 432, a first level shift circuit 531, a second level shift circuit 532 and a buffer circuit 630.

The configuration and the operation of the voltage switch circuits 431 and 432 are the same as described with reference to FIGS. 8 and 9. Compared with the second level shift circuit 512 in FIG. 8, the second level shift circuit 532 in FIG. 12 is coupled to the first intermediate voltage VEM instead of the first conversion voltage VEE and receives the input signal VI and the inversion input signal VIb instead of the positive intermediate signal VP and the negative intermediate signal VN.

The first level shift circuit 531 is coupled between the first voltage node nP1 and the second intermediate voltage VGM. The second level shift circuit 532 is coupled between the second voltage node nP2 and the first intermediate voltage VEM. The first level shift circuit 531 latches the voltage level corresponding to the input signal VI using the first intermediate voltage VEM and then converts the latched voltage level using the second intermediate voltage VGM and the first conversion voltage VEE to generate a first intermediate signal V11 transitioning between the second intermediate voltage VGM and the first conversion voltage VEE. The second level shift circuit 532 latches the voltage level corresponding to the input signal VI using the second intermediate voltage VGM and then converts the latched voltage level using the first intermediate voltage VEM and the second conversion voltage VGG to generate a second intermediate signal V12 transitioning between the first intermediate voltage VEM and the second conversion voltage VGG.

The buffer circuit 630 is coupled between the first conversion voltage VEE and the second conversion voltage VGG. The buffer circuit 630 may further amplify the first and second intermediate signals V11 and V12, which have the reduced swing ranges, to generate the output signal VO that transitions fully between the first conversion voltage VEE and the second conversion voltage VGG. The buffer circuit may include a first inverter P7 and N7 and a second inverter P8 and N8.

Referring to FIGS. 12 and 13, as described above, the level shifter 330 may perform the latch operation during the latch time tD, that is, the time intervals t1 to t2 and t3 to t4, based on the intermediate voltages VEM and VGM and after the latch time tD, the level shifter 330 may perform the level shifting operation based on the conversion voltages VEE and VGG.

The first intermediate signal V11 transitions between the first conversion voltage VEE and the second intermediate voltage VGM. The second intermediate signal V12 transitions between the first intermediate voltage VEM and the second conversion voltage VGM.

The buffer circuit 630 may further amplify the first and second intermediate signals V11 and V12, which have the reduced swing ranges, to generate the output signal VO that transitions fully between the first conversion voltage VEE and the second conversion voltage VGG.

Figure 14:
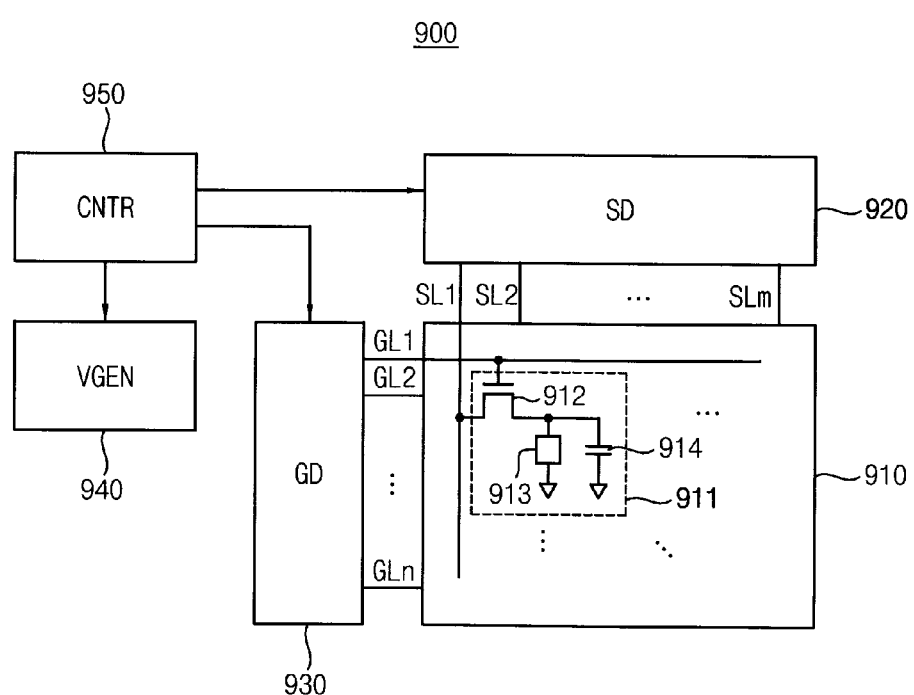
FIG. 14 is a block diagram illustrating a display device according to example embodiments.

FIG. 14 is a block diagram illustrating a display device according to example embodiments.

Referring to FIG. 14, a display device 900 may include a display panel 910, a source driver (SD) 920, a gate driver (GD) 930 and a timing controller (CNTR) 950. In some example embodiments, the display device 900 may further include a voltage generator (VGEN) 940 for generating high voltages and/or negative voltages based on the power supply voltages. In other example embodiments, the voltage generator 940 may be omitted and the necessary voltage may be provided from an external device.

The display panel 910 may include a plurality of pixels coupled to a plurality of source lines SL1 through SLm and a plurality of gate lines GL1 through GLn. For example, each pixel 911 may include a thin-film transistor (TFT) 912, a liquid crystal 913 and a storage capacitor 914 as illustrated in FIG. 14.

The source driver 920 drives the source lines SL1 through SLm and the gate driver 930 drives the gate lines GL1 through GLn. The timing controller 950 controls the display panel 910, the source driver 920 and the gate driver 930.

At least one of the source driver 920 and the gate driver 930 may include a voltage level conversion circuit according to example embodiments. As described above, the voltage level conversion circuit may include the voltage switch circuit configured to provide the intermediate voltage and the conversion voltage sequentially in response to the switch signal, and the level shift circuit configured to latch the voltage level corresponding to the input signal using the intermediate voltage and then convert the latched voltage level using the conversion voltage to generate the output signal.

Figure 15:
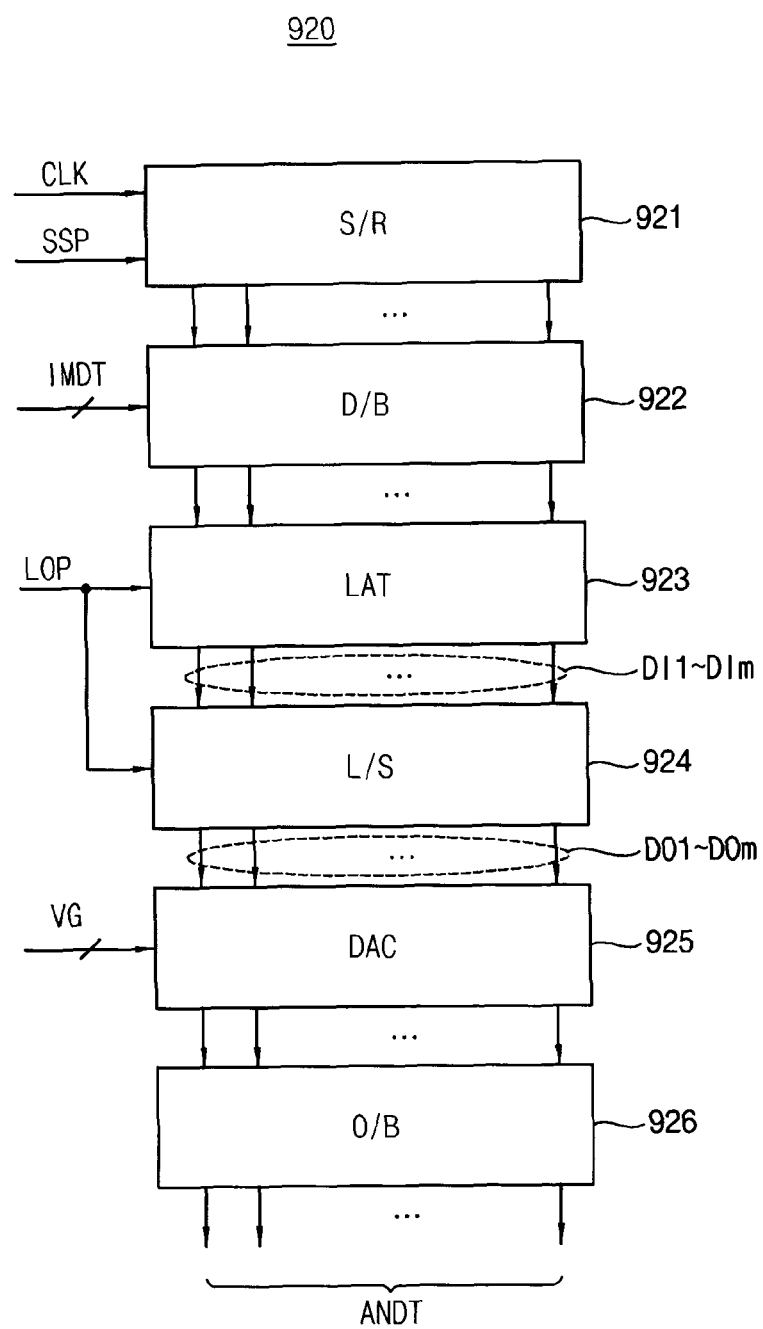
FIG. 15 is a block diagram illustrating an example of a source driver in the display device of FIG. 14.

FIG. 15 is a block diagram illustrating an example of a source driver in the display device of FIG. 14.

Referring to FIG. 15, the source driver 920 may include a shift register (S/R) 921, a data buffer (D/B) 922, a latch block (LAT) 923, a level shifter block (L/S) 924, a digital-to-analog converter block (DAC) 925 and an output buffer (O/B) 926.

The shift register 921 generates control signals, which are activated sequentially, in response to a start pulse signal SSP and a clock signal CLK. The data buffer 922 stores digital image data IMDT in synchronization with the control signals. The latch block 923 receives and latches data bits from the data buffer 922 and provides the latched data bits DI1 through DIm to the level shifter block 924 in response to a latch output pulse signal LOP. The level shifter block 925 provides output data DO1 through DOm, which are level-shifted, based on the input data DI1 through DIm and the latch output pulse signal LOP. The DAC block 925, using gray-scale voltages VG, converts the output data DO1 through DOm to analog signals. The output buffer 926 buffers the outputs of the DAC block 924 and generates analog signals ANDT for driving the source lines SL1 through SLm.

Figure 16:
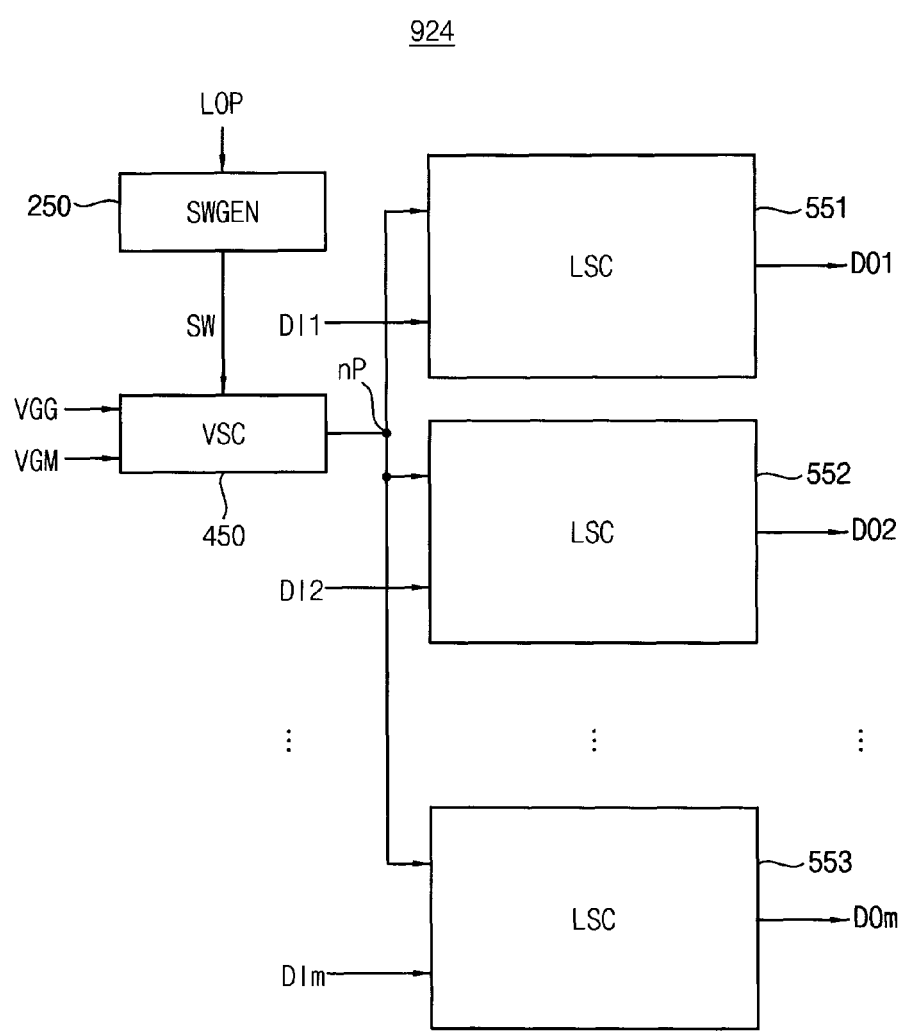
FIG. 16 is a block diagram illustrating a voltage level conversion circuit according to example embodiments.

FIG. 16 is a block diagram illustrating a voltage level conversion circuit according to example embodiments.

A voltage level conversion circuit 924 in FIG. 16 may correspond to the level shifter block in FIG. 15. Referring to FIG. 16, the voltage level conversion circuit 924 may include a switch signal generator (SWGEN) 250, a voltage switch circuit (VSC) 450 and a plurality of level shift circuits 551, 552 and 553.

The switch signal generator 250 may generate a switch signal SW based on the latch output pulse signal LOP. The latch output pulse signal LOP may indicate the transition timing of the input signals DI1 through DIm. The latch output pulse signal LOP may correspond to the above-mentioned input control signal TIN.

The voltage switch circuit 450 may provide an intermediate voltage VGM and a conversion voltage VGG sequentially to a voltage node nP in response to the switch signal SW.

The plurality of level shift circuit 551, 552 and 553 may be coupled commonly to the voltage node nP to receive the intermediate voltage VGM and the conversion voltage VGG sequentially. As described above, Each of the level shift circuits 551, 552 and 553 may latch a voltage level corresponding to each of the input signals DI1 through DIm using the intermediate voltage VGM and then convert the latched voltage level using the conversion voltage VGG to generate each of the output signals DO1 through DOm.

The occupation area of the voltage level conversion circuit 924 may be further reduced by coupling the plurality of level shift circuits 551, 552 and 553 commonly to the single voltage switch circuit 450.

Figure 17:
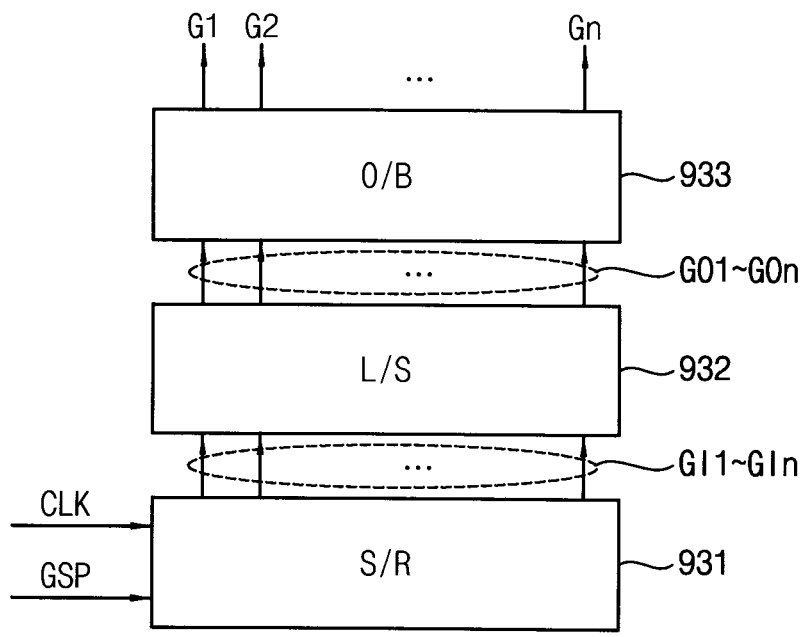
FIG. 17 is a block diagram illustrating an example of a gate driver in the display device of FIG. 14.

FIG. 17 is a block diagram illustrating an example of a gate driver in the display device of FIG. 14.

Referring to FIG. 17, a gate driver 930 may include a shift register (S/R) 931, a level shifter block (L/S) 932 and an output buffer (O/B) 933.

The shift register 931 generates input signals GI1 through GIn, which are activated sequentially, in response to a start pulse signal GSP and a clock signal CLK. The level shifter block 932 provides output signals GO1 through GOn, which are level-shifted from the input signals GI1 through GIn. The output buffer 933 buffers the output signals GO1 through GOn of the level shifter block 932 and generates gate signals G1 through Gn for driving the gate lines GL1 through GLn.

Figure 18:
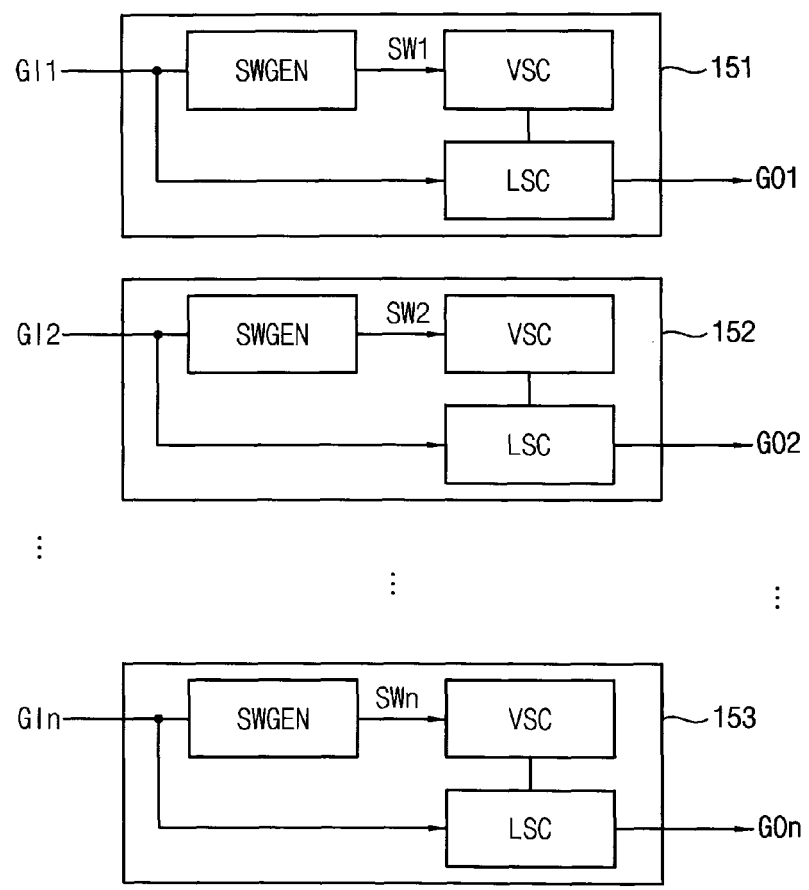
FIG. 18 is a block diagram illustrating a voltage level conversion circuit according to example embodiments.

FIG. 18 is a block diagram illustrating a voltage level conversion circuit according to example embodiments.

A voltage level conversion circuit 932 in FIG. 18 may correspond to the level shifter block in FIG. 17. Referring to FIG. 18, the voltage level conversion circuit 932 may include a plurality of conversion units 151, 152 and 153. The conversion units 151, 152 and 153 convert the voltage levels of the input signals GI1 through GIn to generate the output signals GO1 through GOn, respectively. Each of the conversion units 151, 152 and 153 may include a switch signal generator SWGEN, a voltage switch circuit VSC and a level shift circuit LCS as described above.

The switch signal generator SWGEN may receive the corresponding input signal GIi (i=1, 2, ..., n) and generate the respective switch signal SWi based on the transition timing of the input signal GIi. In this case, the input signal GIi itself may correspond to the above-mentioned input control signal TIN.

Figure 19:
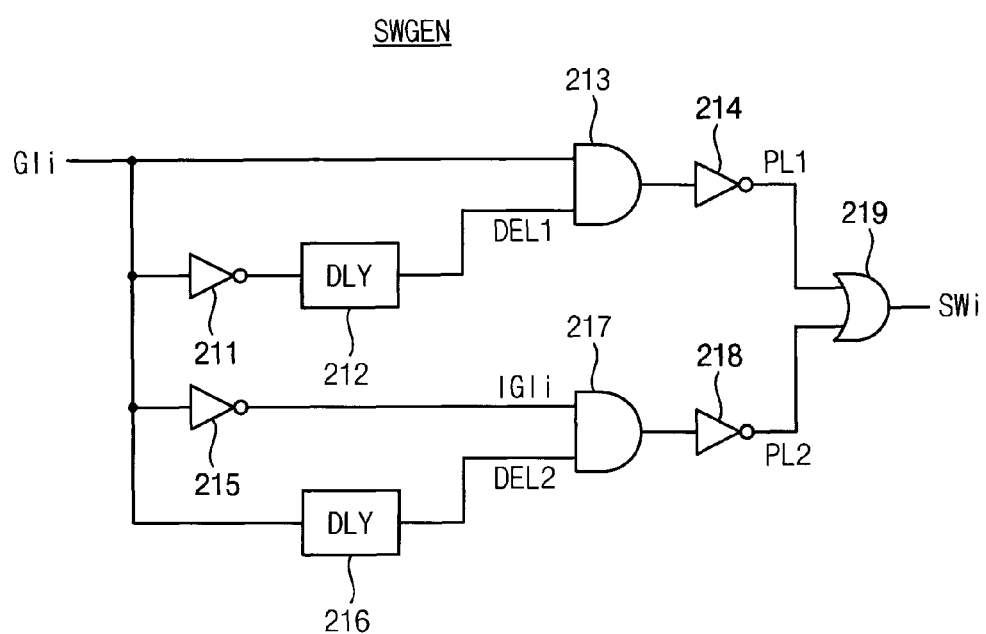
FIG. 19 is a circuit diagram illustrating an example of a switch signal generator in the voltage level conversion circuit of FIG. 18.
Figure 20:
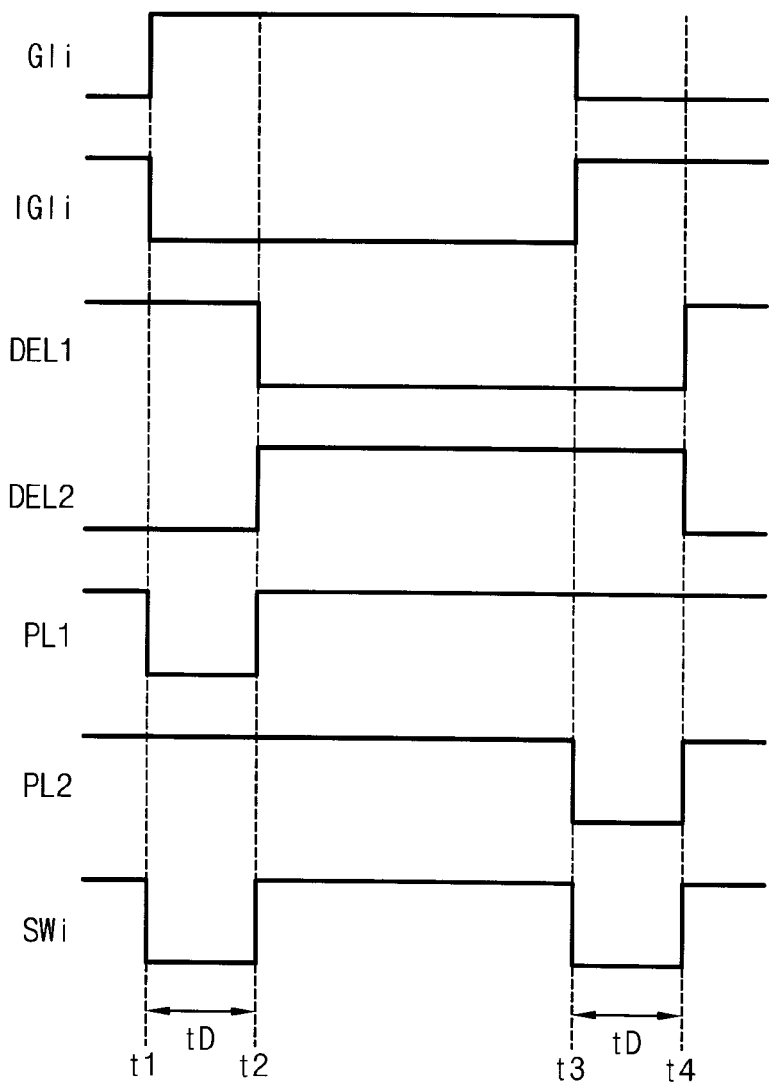
FIG. 20 is a timing diagram illustrating example operation of the switch signal generator of FIG. 19.

FIG. 19 is a circuit diagram illustrating an example of a switch signal generator in the voltage level conversion circuit of FIG. 18, and FIG. 20 is a timing diagram illustrating an operation of the switch signal generator of FIG. 19.

Referring to FIG. 19, the switch signal generator SWGEN may include inverters 211, 214, 215 and 218, delay elements 212 and 216, AND gates 213 and 217 and an OR gate 219, which are coupled as illustrated in FIG. 19.

Referring to FIGS. 19 and 20, the first AND gate 213 performs an AND logic operation on an input signal GIi and a first delay signal DEL1, and the inverter 214 inverts the output of the first AND gate 213 to generate a first pulse signal PL1. The second AND gate 217 performs an AND logic operation on an inversion input signal IGIi and a second delay signal DEL2, and the inverter 218 inverts the output of the second AND gate 217 to generate a second pulse signal PL2. The first pulse signal PL1 transitions in synchronization with a rising edge of the input signal GIi and the second pulse signal PL2 transitions in synchronization with a falling edge of the input signal GIi. The OR gate 219 performs an OR logic operation on the first pulse signal PL1 and the second pulse signal PL2 to generate the switch signal SWi. As a result, the switch signal SWi may transition to relatively a lower voltage level in synchronization with the transition timing of the input signal GIi and the lower voltage level of the switch signal SWi may be maintained for the latch time tD that corresponds to the delay time of the delay elements 212 and 216. As described above, in response to the switch signal SWi, the corresponding level shift circuit LSC may perform the latch operation during time interval t1 to t2 and t3 to t4, that is, during the latch time tD, and then perform the level shifting operation. Through such step by step conversion, the voltage level conversion range may be enlarged stable and the power consumption may be reduced.

Figure 21:
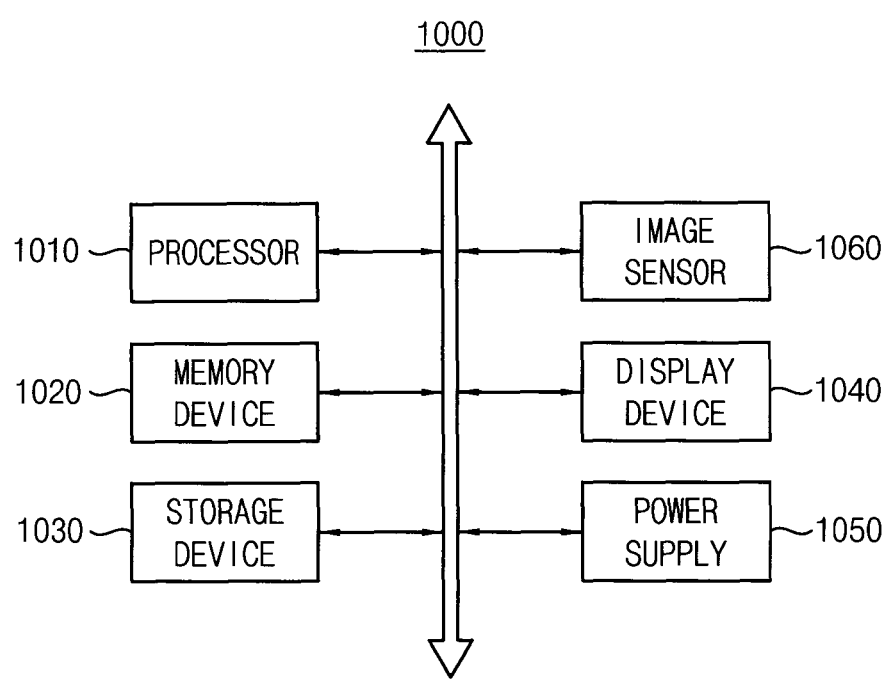
FIG. 21 is a block diagram illustrating a computing system including a display device according to example embodiments.

FIG. 21 is a block diagram illustrating a computing system including a display device according to example embodiments.

Referring to FIG. 21, a computing system 1000 may include a processor 1010, a memory device 1020, a storage device 1030, a display device 1040, a power supply 1050 and an image sensor 1060. Although not illustrated in FIG. 21, the computing system 1000 may further include ports that communicate with a video card, a sound card, a memory card, a USB device, other electronic devices, etc.

The processor 1010 may perform various calculations or tasks. According to embodiments, the processor 1010 may be a microprocessor or a CPU. The processor 1010 may communicate with the memory device 1020, the storage device 1030, and the display device 1040 via an address bus, a control bus, and/or a data bus. In some embodiments, the processor 1010 may be coupled to an extended bus, such as a peripheral component interconnection (PCI) bus. The memory device 1020 may store data for operating the computing system 1000. For example, the memory device 1020 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The storage device 1030 may include a solid state drive (SSD), a hard disk drive (HDD), a CD-ROM, etc. The computing system 1000 may further include an input device such as a touch screen, a keyboard, a keypad, a mouse, etc., and an output device such as a printer, a display device, etc. The power supply 1050 supplies operation voltages for the computing system 1000.

The image sensor 1060 may communicate with the processor 1010 via the buses or other communication links. The image sensor 1060 may be integrated with the processor 1010 in one chip, or the image sensor 1060 and the processor 1010 may be implemented as separate chips.

At least a portion of the computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 1000 may be a computing system using a data loading circuit, e.g., a digital camera, a mobile phone, a smart phone, a portable multimedia player (PMP), a personal digital assistant (PDA), a computer, etc.

Figure 22:
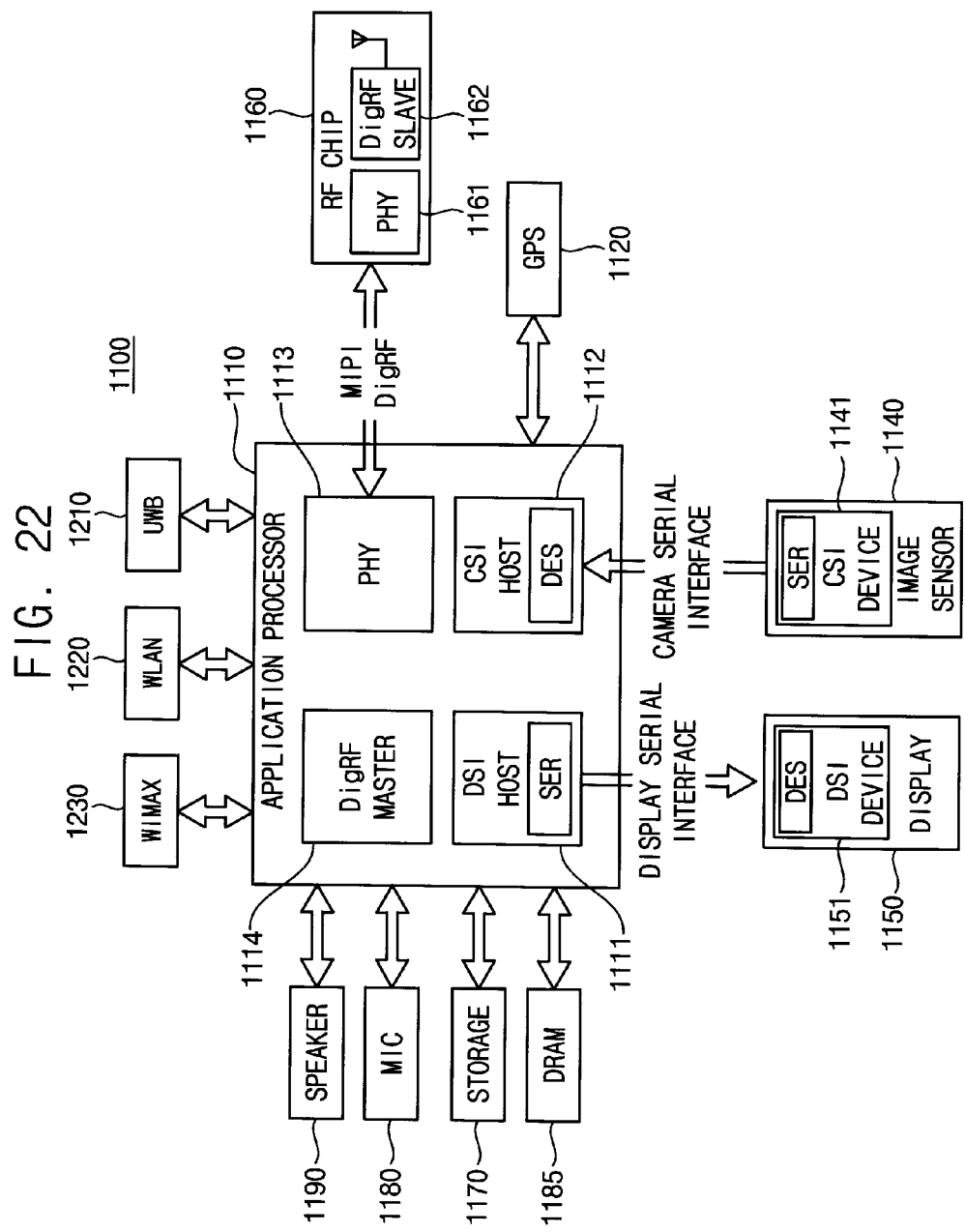
FIG. 22 is a block diagram illustrating an interface employable in the computing system of FIG. 21.

FIG. 22 is a block diagram illustrating an interface employable in the computing system of FIG. 21.

Referring to FIG. 22, a computing system 1100 may be implemented by a data processing device that uses or supports a mobile industry processor interface (MIPI) interface. The computing system 1100 may include an application processor 1110, an image sensor 1140, a display device 1150, etc. A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1210, a wireless local area network (WLAN) 1220, a worldwide interoperability for microwave access (WIMAX) 1230, etc. Other structures and interfaces of the computing system 1000 may also be used.

The voltage level conversion circuit according to example embodiments of inventive concepts may be applied in various integrated circuits including circuit blocks operating based on different voltages. Particularly the voltage level conversion circuit may be applied further usefully to a device and/or a system such as a display device that requires a large number of level shifters.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage level conversion circuit comprising:
   a voltage switch circuit configured to sequentially output an intermediate voltage and a conversion voltage in response to a switch signal; and
   a level shift circuit configured to latch a voltage level corresponding to an input signal using the intermediate voltage, and to convert the latched voltage level using the conversion voltage to generate an output signal;
   wherein the input signal transitions between a first voltage and a second voltage higher than the first voltage, and the level shift circuit is configured to transition the output signal between the first voltage and the conversion voltage higher than the second voltage; and
   wherein the voltage switch circuit includes
      a first transistor coupled between the intermediate voltage and a voltage node, a gate of the first transistor being configured to receive the switch signal, and
      a second transistor coupled between the conversion voltage and the voltage node, a gate of the second transistor being configured to receive an inverted version of the switch signal.

2. The voltage level conversion circuit of claim 1, further comprising:
   a switch signal generator configured to generate the switch signal based on an input control signal indicative of a transition timing of the input signal.

3. The voltage level conversion circuit of claim 2, wherein the switch signal generator is configured to transition the switch signal to a first switch voltage in response to the input control signal, and to a second switch voltage after a latch time interval.

4. The voltage level conversion circuit of claim 1, wherein the level shift circuit further comprises:
   a third transistor coupled between the voltage node and a first node, a gate of the third transistor being coupled to a second node, the second node being configured to output the output signal;
   a fourth transistor coupled between the voltage node and the second node, a gate of the fourth transistor being coupled to the first node;
   a fifth transistor coupled between the first node and the first voltage, a gate of the fifth transistor being configured to receive the input signal; and
   a sixth transistor coupled between the second node and the first voltage, a gate of the sixth transistor being configured to receive an inverted version of the input signal.

5. The voltage level conversion circuit of claim 1, wherein the intermediate voltage includes a first intermediate voltage and a second intermediate voltage higher than the first intermediate voltage, the conversion voltage includes a first conversion voltage lower than the first intermediate voltage and a second conversion voltage higher than the second intermediate voltage.

6. The voltage level conversion circuit of claim 4, wherein the first intermediate voltage is equal to the first voltage and the second intermediate voltage is equal to the second voltage.

7. A The voltage level conversion circuit comprising:
   a voltage switch circuit configured to sequentially output an intermediate voltage and a conversion voltage in response to a switch signal; and
   a level shift circuit configured to latch a voltage level corresponding to an input signal using the intermediate voltage, and to convert the latched voltage level using the conversion voltage to generate an output signal;
   wherein the voltage switch circuit includes
      a first voltage switch circuit configured to sequentially output a first intermediate voltage and a first conversion voltage lower than the first intermediate voltage to a first voltage node in response to the switch signal, and
      a second voltage switch circuit configured to sequentially output a second intermediate voltage and a second conversion voltage higher than the second intermediate voltage to a second voltage node in response to the switch signal; and
   wherein the first voltage switch circuit includes
      a first transistor coupled between the first intermediate voltage and the first voltage node, a gate of the first transistor being configured to receive an inverted version of the switch signal, and
      a second transistor coupled between the first conversion voltage and the first voltage node, a gate of the second transistor being configured to receive the switch signal.

8. The voltage level conversion circuit of claim 7, wherein the second voltage switch circuit comprises:
   a third transistor coupled between the second intermediate voltage and the second voltage node, a gate of the third transistor being configured to receive the switch signal; and
   a fourth transistor coupled between the second conversion voltage and the second voltage node, a gate of the fourth transistor being configured to receive the inverted version of the switch signal.

9. The voltage level conversion circuit of claim 7, wherein the level shift circuit comprises:
   a first level shift circuit coupled between the first voltage node and the second intermediate voltage, the first level shift circuit being configured to latch the voltage level corresponding to the input signal using the first intermediate voltage, and to convert the latched voltage level corresponding to the input signal using the second intermediate voltage and the first conversion voltage to generate an intermediate signal transitioning between the second intermediate voltage and the first conversion voltage; and
   a second level shift circuit coupled between the second voltage node and the first conversion voltage, the second level shift circuit being configured to latch a voltage level corresponding to the intermediate signal using the second intermediate voltage, and to convert the latched voltage level corresponding to the intermediate signal using the first conversion voltage and the second conversion voltage to generate the output signal transitioning between the first conversion voltage and the second conversion voltage.

10. A display device comprising:
    a display panel including a plurality of pixels coupled to a plurality of source lines and a plurality of gate lines;
    a source driver configured to drive the plurality of source lines;
    a gate driver configured to drive the plurality of gate lines; and
    a timing controller configured to control the display panel, the source driver and the gate driver,
    at least one of the source driver and the gate driver including a voltage level conversion circuit, the voltage level conversion circuit including,
       a voltage switch circuit configured to sequentially output an intermediate voltage and a conversion voltage in response to a switch signal, and a level shift circuit configured to latch a voltage level corresponding to an input signal using the intermediate voltage, and to convert the latched voltage level using the conversion voltage to generate an output signal, wherein the input signal transitions between a first voltage and a second voltage higher than the first voltage, and the level shift circuit is configured to transition the output signal between the first voltage and the conversion voltage higher than the second voltage, and wherein the voltage switch circuit includes
- a first transistor coupled between the intermediate voltage and a voltage node, a gate of the first transistor being configured to receive the switch signal, and
- a second transistor coupled between the conversion voltage and the voltage node, a gate of the second transistor being configured to receive an inverted version of the switch signal.

11. The display device of claim 10, wherein the voltage level conversion circuit further comprises:
a switch signal generator configured to generate the switch signal based on a transition timing of the input signal.

12. The display device of claim 10, further comprising:
a plurality of level shift circuits commonly coupled to the voltage switch circuit.

13. A voltage level conversion circuit comprising:
a level shift circuit configured to latch an intermediate voltage during a latch time period in response to an input signal, the level shift circuit being further configured to, after expiration of the latch time period, generate an output signal by level shifting the latched intermediate voltage to a conversion voltage, a magnitude of the conversion voltage being greater than a magnitude of the intermediate voltage; and a voltage switch circuit configured to sequentially output the intermediate voltage and the conversion voltage in response to a switch signal, the voltage switch circuit including
- a first transistor coupled between the intermediate voltage and a voltage node, a gate of the first transistor being configured to receive the switch signal, and
- a second transistor coupled between the conversion voltage and the voltage node, a gate of the second transistor being configured to receive an inverted version of the switch signal.

14. The voltage level conversion circuit of claim 13, further comprising:
a switch signal generator configured to generate the switch signal based on an input control signal indicative of a transition timing of the input signal.

15. A display device comprising:
a display panel including a plurality of pixels coupled to a plurality of source lines and a plurality of gate lines;
a source driver configured to drive the plurality of source lines;
a gate driver configured to drive the plurality of gate lines; and
a timing controller configured to control the display panel, the source driver and the gate driver; wherein
at least one of the source driver and the gate driver includes the voltage level conversion circuit of claim 13.

* * * * *